(12) United States Patent
Nakagawa et al.

(10) Patent No.: US 11,115,003 B2
(45) Date of Patent: Sep. 7, 2021

(54) ACOUSTIC WAVE DEVICE, MULTIPLEXER, HIGH-FREQUENCY FRONT END CIRCUIT, AND COMMUNICATION APPARATUS

(71) Applicant: Murata Manufacturing Co., Ltd., Nagaokakyo (JP)

(72) Inventors: Ryo Nakagawa, Nagaokakyo (JP); Hideki Iwamoto, Nagaokakyo (JP); Tsutomu Takai, Nagaokakyo (JP); Yuichi Takamine, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/920,811

(22) Filed: Jul. 6, 2020

(65) Prior Publication Data

US 2020/0336133 A1 Oct. 22, 2020

Related U.S. Application Data

(63) Continuation of application No. PCT/JP2018/046700, filed on Dec. 19, 2018.

(30) Foreign Application Priority Data

Jan. 12, 2018 (JP) .............................. JP2018-003869

(51) Int. Cl.
*H03H 9/64* (2006.01)
*H03H 9/02* (2006.01)
*H03H 9/145* (2006.01)
*H03H 9/25* (2006.01)
*H03H 9/72* (2006.01)
*H04B 1/04* (2006.01)

(52) U.S. Cl.
CPC ...... *H03H 9/6489* (2013.01); *H03H 9/02559* (2013.01); *H03H 9/145* (2013.01);
(Continued)

(58) Field of Classification Search
CPC .......... H03H 9/6489; H03H 9/72; H03H 9/25; H03H 9/145; H03H 9/6483;
(Continued)

(56) References Cited

U.S. PATENT DOCUMENTS

2003/0168930 A1  9/2003  Kando et al.
2012/0182088 A1  7/2012  Inoue et al.
(Continued)

FOREIGN PATENT DOCUMENTS

JP  2003-142984 A   5/2003
JP  2012-151697 A   8/2012
(Continued)

OTHER PUBLICATIONS

Official Communication issued in International Patent Application No. PCT/JP2018/046700, dated Jan. 22, 2019.

*Primary Examiner* — Yuwen Pan
*Assistant Examiner* — Fatuma G Sherif
(74) *Attorney, Agent, or Firm* — Keating & Bennett, LLP

(57) ABSTRACT

In an acoustic wave device, an antenna end resonator electrically closest to a first terminal is a first acoustic wave resonator. In each of the first acoustic wave resonator and a second acoustic wave resonator, a thickness of a piezoelectric layer is equal to or less than about 3.5λ. A cut angle of the piezoelectric layer of the first acoustic wave resonator is within a range of $\theta_B \pm 4°$. The cut angle of the piezoelectric layer of the second acoustic wave resonator has a larger difference from $\theta_B$ (°) than the cut angle of the piezoelectric layer of the first acoustic wave resonator.

20 Claims, 12 Drawing Sheets

(52) U.S. Cl.
CPC ............ *H03H 9/25* (2013.01); *H03H 9/6483* (2013.01); *H03H 9/72* (2013.01); *H04B 1/04* (2013.01)

(58) Field of Classification Search
CPC ............... H03H 9/02559; H03H 9/725; H03H 9/02574; H03H 9/14538; H04B 1/04; H04B 9/02559; H04B 9/6483; H04B 1/006; H04B 1/0458; H04B 1/18
See application file for complete search history.

(56) References Cited

U.S. PATENT DOCUMENTS

| | | | |
|---|---|---|---|
| 2013/0285768 A1* | 10/2013 | Watanabe | ................ H03H 3/02 333/193 |
| 2017/0005638 A1* | 1/2017 | Otagawa | .............. H03H 9/6483 |
| 2017/0244383 A1 | 8/2017 | Yasuda | |
| 2018/0097500 A1 | 4/2018 | Mimura | |
| 2018/0097508 A1 | 4/2018 | Iwamoto et al. | |
| 2018/0254766 A1* | 9/2018 | Shimozono | ........ H03H 9/02818 |
| 2020/0328728 A1* | 10/2020 | Nakagawa | ............. H03H 9/568 |

FOREIGN PATENT DOCUMENTS

| | | |
|---|---|---|
| JP | 2017-147674 A | 8/2017 |
| WO | 2010/131737 A1 | 11/2010 |
| WO | 2012/086639 A1 | 6/2012 |
| WO | 2016/208446 A1 | 12/2016 |
| WO | 2017/006742 A1 | 1/2017 |

* cited by examiner

ACOUSTIC WAVE DEVICE, MULTIPLEXER, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2018-003869 filed on Jan. 12, 2018 and is a Continuation Application of PCT Application No. PCT/JP2018/046700 filed on Dec. 19, 2018. The entire contents of each application are hereby incorporated herein by reference.

BACKGROUND OF THE INVENTION

1. Field of the Invention

The present invention generally relates to an acoustic wave device, a multiplexer, a high-frequency front end circuit, and a communication apparatus. More specifically, the present invention relates to an acoustic wave device including a plurality of acoustic wave resonators, a multiplexer including the acoustic wave device, a high-frequency front end circuit including the multiplexer, and a communication apparatus including the high-frequency front end circuit.

2. Description of the Related Art

An existing surface acoustic wave device (acoustic wave resonator) including a piezoelectric film has been known (see, for example, International Publication No. 2012/086639).

The surface acoustic wave device described in International Publication No. 2012/086639 includes a support substrate, a high-acoustic-velocity film, a low-acoustic-velocity film, a piezoelectric film, and an IDT electrode. The high-acoustic-velocity film is a film in which the acoustic velocity of a bulk wave propagating in the high-acoustic-velocity film is higher than the acoustic velocity of an acoustic wave propagating in the piezoelectric film. The low-acoustic-velocity film is laminated on the high-acoustic-velocity film and is a film in which the acoustic velocity of the bulk wave propagating in the low-acoustic-velocity film is lower than the acoustic velocity of the bulk wave propagating in the piezoelectric film. The piezoelectric film has piezoelectricity and is laminated on the low-acoustic-velocity film. The IDT electrode is formed on the piezoelectric film. In the surface acoustic wave device disclosed in International Publication No. 2012/086639, a Q value can be increased, and loss of the acoustic wave device can be reduced.

However, when a laminate structure including the high-acoustic-velocity film, the low-acoustic-velocity film, and the piezoelectric film is used as in the existing acoustic wave resonator described in International Publication No. 2012/086639, spurious emission of a Rayleigh wave is generated on a lower frequency side than a pass band and attenuation characteristics on the low frequency side are deteriorated. In particular, when an acoustic wave device is configured using a plurality of existing acoustic wave resonators, the spurious emission is generated in a pass band of a low frequency-side filter connected to an antenna in common with the acoustic wave device.

SUMMARY OF THE INVENTION

Preferred embodiments of the present invention provide acoustic wave devices, multiplexers, high-frequency front end circuits, and communication apparatuses that are each capable of reducing spurious emission of a Rayleigh wave, which is generated on a lower frequency side than a pass band, while reducing or preventing deterioration in characteristics of the pass band.

An acoustic wave device according to a preferred embodiment of the present invention is provided between a first terminal defining an antenna terminal and a second terminal different from the first terminal. The acoustic wave device includes a plurality of acoustic wave resonators. The plurality of acoustic wave resonators include a plurality of series arm resonators and a plurality of parallel arm resonators. The plurality of series arm resonators are provided on a first path connecting the first terminal and the second terminal. The plurality of parallel arm resonators are provided on a plurality of second paths connecting a plurality of nodes on the first path and ground, respectively. When an acoustic wave resonator that is electrically closest to the first terminal among the plurality of acoustic wave resonators is an antenna end resonator, the antenna end resonator is a first acoustic wave resonator. At least one acoustic wave resonator other than the antenna end resonator among the plurality of acoustic wave resonators is a second acoustic wave resonator. Each of the first acoustic wave resonator and the second acoustic wave resonator includes a piezoelectric layer, an IDT electrode, a high-acoustic-velocity member, and a low-acoustic-velocity film. The IDT electrode is provided on the piezoelectric layer and includes a plurality of electrode fingers. The high-acoustic-velocity member is located on a side opposite to the IDT electrode with the piezoelectric layer interposed therebetween. In the high-acoustic-velocity member, an acoustic velocity of a bulk wave propagating in the high-acoustic velocity member is higher than an acoustic velocity of an acoustic wave propagating in the piezoelectric layer. The low-acoustic-velocity film is provided between the high-acoustic-velocity member and the piezoelectric layer. In the low-acoustic-velocity film, an acoustic velocity of a bulk wave propagating in the low-acoustic-velocity film is lower than an acoustic velocity of a bulk wave propagating in the piezoelectric layer. A thickness of the piezoelectric layer is equal to or less than about $3.5\lambda$ where a wavelength of an acoustic wave, which is determined by an electrode finger cycle being a cycle of the plurality of electrode fingers of the IDT electrode, is $\lambda$. A cut angle of the piezoelectric layer of the first acoustic wave resonator is within a range of $\theta_B \pm 4°$ with reference to $\theta_B$ (°) obtained by an equation (1) where the wavelength is $\lambda$ (μm), a thickness of the IDT electrode is $T_{IDT}$ (μm), a specific gravity of the IDT electrode is $\rho$ (g/cm$^3$), a duty ratio as a value obtained by dividing a width of the electrode fingers by a half value of the electrode finger cycle is $D_u$, a thickness of the piezoelectric layer is $T_{LT}$ (μm), and a thickness of the low-acoustic-velocity film is $T_{VL}$ (μm). A cut angle of the piezoelectric layer of the second acoustic wave resonator has larger difference from $\theta_B$ (°) than the cut angle of the piezoelectric layer of the first acoustic wave resonator:

$$\theta_B = 43.09 - 27.5 \times \left(\frac{T_{IDT}}{\lambda} \times \rho - 0.1956\right) - 19.2 \times (D_u - 0.5) + \qquad \text{Equation (1)}$$
$$17.4578 \times \left(\frac{T_{LT}}{\lambda} - 0.35\right) + 5.619 \times \left(\frac{T_{VL}}{\lambda} - 0.3\right) +$$
$$32.66 \times \left\{\left(\frac{T_{LT}}{\lambda} - 0.35\right)^2 - 0.0125\right\} +$$

-continued $$24.63 \times \left(\frac{T_{LT}}{\lambda} - 0.35\right) \times \left(\frac{T_{VL}}{\lambda} - 0.3\right).$$

An acoustic wave device according to a preferred embodiment of the present invention is provided between a first terminal defining an antenna terminal and a second terminal being different from the first terminal. The acoustic wave device includes a plurality of acoustic wave resonators. The plurality of acoustic wave resonators include a plurality of series arm resonators and a plurality of parallel arm resonators. The plurality of series arm resonators are provided on a first path connecting the first terminal and the second terminal. The plurality of parallel arm resonators are provided on a plurality of second paths connecting a plurality of nodes on the first path and ground, respectively. When an acoustic wave resonator that is electrically closest to the first terminal among the plurality of acoustic wave resonators is an antenna end resonator, the antenna end resonator is a first acoustic wave resonator. At least one acoustic wave resonator other than the antenna end resonator among the plurality of acoustic wave resonators is a second acoustic wave resonator. Each of the first acoustic wave resonator and the second acoustic wave resonator includes a piezoelectric layer, an IDT electrode, a high-acoustic-velocity member, and a low-acoustic-velocity film. The IDT electrode is provided on the piezoelectric layer and has a plurality of electrode fingers. The high-acoustic-velocity member is located on a side opposite to the IDT electrode with the piezoelectric layer interposed therebetween. In the high-acoustic-velocity member, an acoustic velocity of a bulk wave propagating in the high-acoustic velocity member is higher than an acoustic velocity of an acoustic wave propagating in the piezoelectric layer. The low-acoustic-velocity film is provided between the high-acoustic-velocity member and the piezoelectric layer. In the low-acoustic-velocity film, an acoustic velocity of a bulk wave propagating in the low-acoustic-velocity film is lower than an acoustic velocity of a bulk wave propagating in the piezoelectric layer. A thickness of the piezoelectric layer is equal to or less than about 3.5λ where a wavelength of an acoustic wave, which is determined by an electrode finger cycle being a cycle of the plurality of electrode fingers of the IDT electrode, is λ. An intensity of a Rayleigh wave response generated in the first acoustic wave resonator is smaller than an intensity of a Rayleigh wave response generated in the second acoustic wave resonator.

A multiplexer according to a preferred embodiment of the present invention includes a first filter including the acoustic wave device and a second filter. The second filter is provided between the first terminal and a third terminal that is different from the first terminal. A pass band of the first filter is in a higher frequency range than a pass band of the second filter.

A high-frequency front end circuit according to a preferred embodiment of the present invention includes the multiplexer and an amplifier circuit. The amplifier circuit is connected to the multiplexer.

A communication apparatus according to a preferred embodiment of the present invention includes the high-frequency front end circuit and a signal processing circuit. The signal processing circuit processes a high-frequency signal received by an antenna. The high-frequency front end circuit transmits the high-frequency signal between the antenna and the signal processing circuit.

With the acoustic wave devices, the multiplexers, the high-frequency front end circuits, and the communication apparatuses according to preferred embodiments of the present invention, it is possible to reduce spurious emission of a Rayleigh wave, which is generated on the lower frequency side than a pass band, while reducing or preventing deterioration in characteristics of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
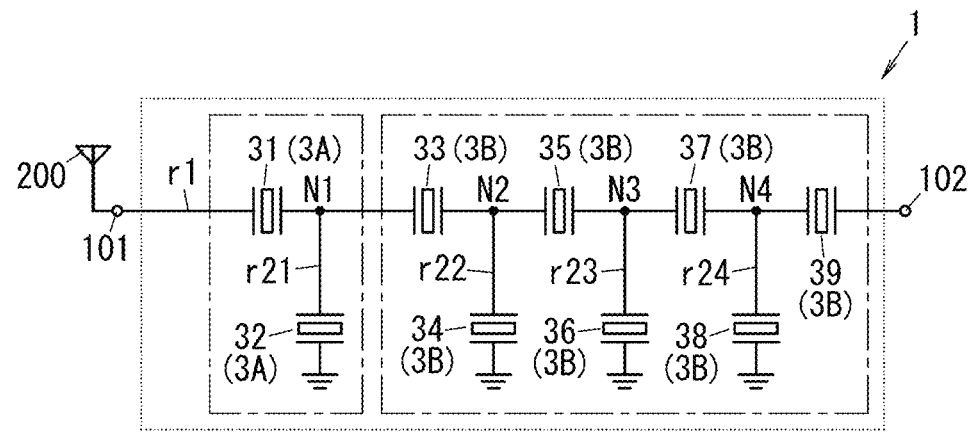
FIG. 1 is a circuit diagram of an acoustic wave device according to a preferred embodiment of the present invention.

Hereinafter, acoustic wave devices, multiplexers, high-frequency front end circuits, and communication apparatuses according to preferred embodiments of the present invention will be described with reference to the drawings.

All of FIGS. 3A, 3B, 4A, 4B, 5A, 5B, 14A, and 14B to be referred in the following preferred embodiments and the like are schematic views, and ratios of the sizes and thicknesses of respective components in the drawings do not necessarily reflect actual dimensional ratios.

Preferred Embodiment (1) Overall Configuration of Acoustic Wave Device

First, the overall configuration of an acoustic wave device 1 according to a preferred embodiment will be described with reference to the drawings.

As illustrated in FIG. 1, the acoustic wave device 1 according to the present preferred embodiment includes a plurality of (nine in the illustrated example) acoustic wave resonators 31 to 39. The plurality of acoustic wave resonators 31 to 39 include a plurality of (five in the illustrated example) series arm resonators (acoustic wave resonators 31, 33, 35, 37, and 39) and a plurality of (four in the illustrated example) parallel arm resonators (acoustic wave resonators 32, 34, 36, and 38).

The plurality of acoustic wave resonators 31, 33, 35, 37, and 39 are provided on a first path r1 connecting a first terminal 101 (common terminal) and a second terminal 102 (input/output terminal). On the first path r1, the plurality of acoustic wave resonators 31, 33, 35, 37, and 39 are connected in series.

The plurality of acoustic wave resonators 32, 34, 36, and 38 are provided on a plurality of second paths r21, r22, r23, and r24 connecting a plurality of nodes N1, N2, N3, and N4 on the first path r1 and the ground, respectively.

The plurality of acoustic wave resonators 31 to 39 define a ladder band pass filter by the above-described connection configuration. That is, the acoustic wave device 1 is a ladder filter. Note that inductors may be connected between connection points of the acoustic wave resonator 32, 34, 36, and 38 and the ground.

The acoustic wave device 1 may have a longitudinally-coupled filter structure in which a plurality of acoustic wave resonators is arranged side by side in the acoustic wave propagation direction.

Figure 2:
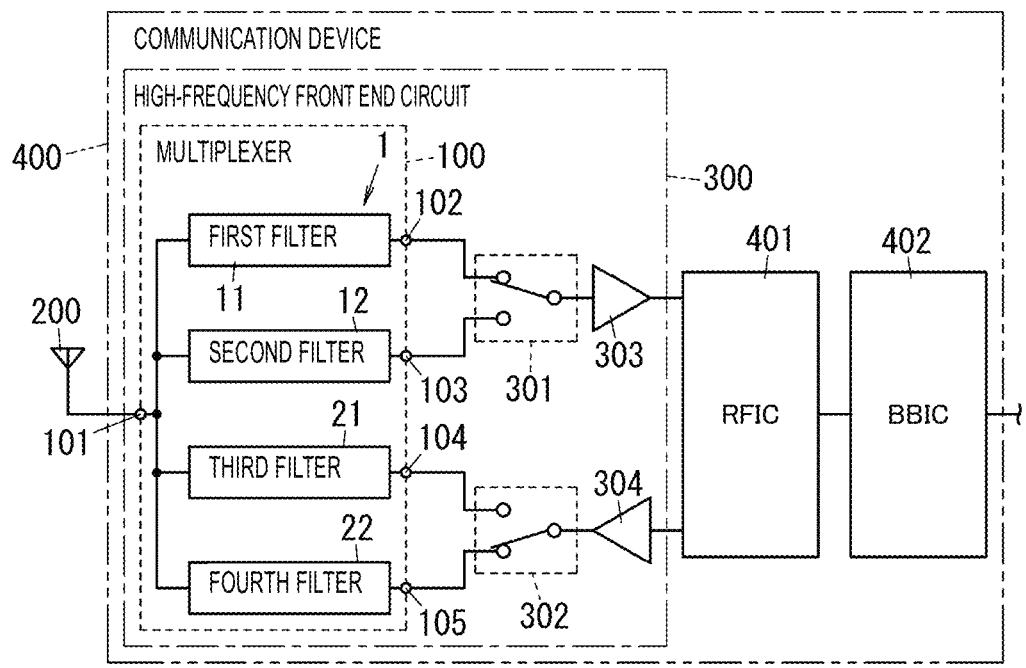
FIG. 2 is a configuration diagram of a communication apparatus according to a preferred embodiment of the present invention including the above-described acoustic wave device.

The acoustic wave device 1 according to the present preferred embodiment is used as, for example, an acoustic wave filter having a predetermined pass band. The acoustic wave device 1 according to the present preferred embodiment is used in, for example, a multiplexer 100 as illustrated in FIG. 2.

(2) Acoustic Wave Resonator

Next, each of components of the acoustic wave device 1 according to the present preferred embodiment will be described with reference to the drawings.

As described above, the acoustic wave device 1 includes the plurality of series arm resonators (acoustic wave resonators 31, 33, 35, 37, and 39) and the plurality of parallel arm resonators (acoustic wave resonators 32, 34, 36, and 38) as the plurality of acoustic wave resonators 31 to 39. Each of the plurality of acoustic wave resonators 31 to 39 is preferably, for example, a surface acoustic wave (SAW) resonator.

The acoustic wave resonator which is electrically closest to the first terminal 101 among the plurality of acoustic wave resonators 31 to 39 is defined as an antenna end resonator. In the example of FIG. 1, the acoustic wave resonator that is electrically closest to the first terminal 101 is the acoustic wave resonator 31. Therefore, the acoustic wave resonator 31 is the antenna end resonator.

(2.1) First Acoustic Wave Resonator

Among the plurality of acoustic wave resonators 31 to 39, the acoustic wave resonator 31 as the antenna end resonator is a first acoustic wave resonator 3A. Further, the acoustic wave resonator 32 that is electrically closest to the first terminal 101 among the plurality of parallel arm resonators (acoustic wave resonators 32, 34, 36, and 38) is also the first acoustic wave resonator 3A.

Figure 3A:
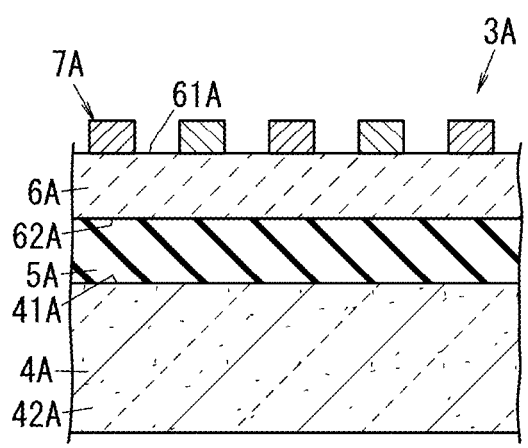
FIG. 3A is a cross-sectional view of a first acoustic wave resonator in the above-described acoustic wave device.

As illustrated in FIG. 3A, each of the first acoustic wave resonators 3A includes a high-acoustic-velocity member 4A, a low-acoustic-velocity film 5A, a piezoelectric layer 6A, and an interdigital transducer (IDT) electrode 7A.

(2.1.1) High-Acoustic-Velocity Member

The high-acoustic-velocity member 4A in a first preferred embodiment of the present invention is a high-acoustic-velocity support substrate 42A. The high-acoustic-velocity support substrate 42A is located on a side opposite to the IDT electrode 7A with the piezoelectric layer 6A interposed therebetween. In the high-acoustic-velocity support substrate 42A, the acoustic velocity of a bulk wave propagating in the high-acoustic-velocity support substrate 42A is higher than the acoustic velocity of an acoustic wave propagating in the piezoelectric layer 6A. The high-acoustic-velocity support substrate 42A supports the low-acoustic-velocity film 5A, the piezoelectric layer 6A, and the IDT electrode 7A.

The high-acoustic-velocity support substrate 42A confines the acoustic wave to a portion where the piezoelectric layer 6A and the low-acoustic-velocity film 5A are laminated and prevents the acoustic wave from leaking to the lower side of the high-acoustic-velocity support substrate 42A.

A material of the high-acoustic-velocity support substrate 42A is preferably, for example, silicon, and the thickness of the high-acoustic-velocity support substrate 42A is preferably, for example, about 125 µm. Note that the material of the high-acoustic-velocity support substrate 42A is not limited to silicon and may be, for example, a piezoelectric material such as aluminum nitride, aluminum oxide, silicon carbide, silicon nitride, sapphire, lithium tantalate, lithium niobate, and quartz, various ceramics such as alumina, zirconia, cordierite, mullite, steatite, and forsterite, magnesia, diamond, a material including any of these materials as a main component, or a material including a mixture of the above-described materials as a main component.

(2.1.2) Low-Acoustic-Velocity Film

The low-acoustic-velocity film 5A is a film in which the acoustic velocity of the bulk wave propagating in the low-acoustic-velocity film 5A is lower than the acoustic velocity of the bulk wave propagating in the piezoelectric layer 6A. The low-acoustic-velocity film 5A is provided between the high-acoustic-velocity support substrate 42A and the piezoelectric layer 6A. Since the low-acoustic-velocity film 5A is provided between the high-acoustic-velocity support substrate 42A and the piezoelectric layer 6A, the acoustic velocity of the acoustic wave decreases. Energy of the acoustic wave inherently concentrates on a medium having a low acoustic velocity. Accordingly, an effect of confining the energy of the acoustic wave in the piezoelectric layer 6A and in the IDT electrode 7A in which the acoustic wave is excited can be improved. As a result, loss can be reduced and a Q value can be increased as compared with the case where the low-acoustic-velocity film 5A is not provided.

A material of the low-acoustic-velocity film 5A is preferably, for example, silicon oxide. Note that the material of the low-acoustic-velocity film 5A is not limited to silicon oxide and may be, for example, glass, silicon oxynitride, tantalum oxide, a compound obtained by adding fluorine, carbon, or boron to silicon oxide, or a material including any of the above-described materials as a main component.

When the material of the low-acoustic-velocity film 5A is silicon oxide, temperature characteristics can be improved. The elastic constant of $LiTaO_3$ (lithium tantalate) which is a material of the piezoelectric layer 6A has negative temperature characteristics, whereas silicon oxide has positive temperature characteristics. Therefore, in the acoustic wave device 1, an absolute value of temperature coefficients of frequency (TCF) can be decreased. Further, the intrinsic acoustic impedance of silicon oxide is smaller than the intrinsic acoustic impedance of $LiTaO_3$ which is the material of the piezoelectric layer 6A. It is therefore possible to achieve both an increase in an electromechanical coupling coefficient, that is, expansion of a specific band and an improvement in frequency temperature characteristics.

It is preferable that the thickness of the low-acoustic-velocity film 5A is, for example, equal to or less than about $2.0\lambda$ where the wavelength of the acoustic wave, which is determined by a cycle of electrode fingers (first electrode fingers 73A and second electrode fingers 74A as will be described later) of the IDT electrode 7A, is $\lambda$. By setting the thickness of the low-acoustic-velocity film 5A to be equal to or less than about $2.0\lambda$, film stress can be reduced, and as a result, warpage of a wafer can be reduced. Therefore, improvement in a yield rate and stabilization of the characteristics can be achieved. When the thickness of the low-acoustic-velocity film 5A is in a range of equal to or more than about $0.1\lambda$ and equal to or less than about $0.5\lambda$, the electromechanical coupling coefficient is hardly changed.

(2.1.3) Piezoelectric Layer

The piezoelectric layer 6A is preferably made of, for example, $\Gamma°$ Y-cut X-propagation $LiTaO_3$ piezoelectric single crystal. The $\Gamma°$ Y-cut X-propagation $LiTaO_3$ piezoelectric single crystal is $LiTaO_3$ single crystal cut along a plane whose normal line is an axis rotated from a y axis in a Z-axis direction by $\Gamma°$ with respect to an X axis being a central axis when three crystal axes of the $LiTaO_3$ piezoelectric single crystal are the X axis, the Y axis, and the Z axis. A surface acoustic wave propagates in the $\Gamma°$ Y-cut X-propagation $LiTaO_3$ piezoelectric single crystal in the X-axis direction. The cut angle of the piezoelectric layer 6A is $\Gamma=\theta+90°$ where the cut angle is $\Gamma$ [°] and the Euler angles of the piezoelectric layer 6A are $(\varphi, \theta, \psi)$. It should be noted that $\Gamma$ and $\Gamma\pm180\times n$ have the same meaning (crystallographically equivalent). In this equation, n is a natural number. The piezoelectric layer 6A is not limited to the $\Gamma°$ Y-cut X-propagation $LiTaO_3$ piezoelectric single crystal and may be, for example, $\Gamma°$ Y-cut X-propagation $LiTaO_3$ piezoelectric ceramic.

The piezoelectric layer 6A is provided directly or indirectly on the low-acoustic-velocity film 5A. The thickness of the piezoelectric layer 6A in the thickness direction (first direction D1) of the high-acoustic-velocity support substrate 42A is preferably, for example, equal to or less than about $3.5\lambda$. When the thickness of the piezoelectric layer 6A is equal to or less than about $3.5\lambda$, for example, the Q value increases. Further, by setting the thickness of the piezoelectric layer 6A to be equal to or less than about $2.5\lambda$, for example, the TCF can be decreased. Moreover, by setting the thickness of the piezoelectric layer 6A to be equal to or less than about $1.5\lambda$, for example, it is easy to adjust the acoustic velocity of the acoustic wave.

When the thickness of the piezoelectric layer 6A is equal to or less than about $3.5\lambda$, the Q value increases as described above, but spurious emission of the Rayleigh wave is generated. In the present preferred embodiment, the cut angle $\theta1$ of the piezoelectric layer 6A is defined so as to reduce the spurious emission of the Rayleigh wave even when the thickness of the piezoelectric layer 6A is equal to or less than about $3.5\lambda$. The cut angle $\theta1$ of the piezoelectric layer 6A will be described later.

In each of the first acoustic wave resonators 3A in the acoustic wave device 1, as a mode of the acoustic wave propagating in the piezoelectric layer 6A, a longitudinal wave, an SH wave, an SV wave, and a mode in which these waves are combined are considered. In the first acoustic wave resonator 3A, a mode including the SH wave as a main component is used as a main mode. A higher-order mode is a spurious emission mode that is generated on the higher frequency side than the main mode of the acoustic wave propagating in the piezoelectric layer 6A. As for the mode of the acoustic wave propagating in the piezoelectric layer 6A, whether or not "the mode including the SH wave as the main component is used as the main mode" can be checked by analyzing displacement distribution with a finite element method by using, for example, parameters (material, Euler angles, thickness, and the like) of the piezoelectric layer 6A, parameters (material, thickness, electrode finger cycle, and the like) of the IDT electrode 7A, and parameters (material, thickness, and the like) of the low-acoustic-velocity film 5A, and analyzing strain. The Euler angles of the piezoelectric layer 6A can be obtained by analysis.

The material of the piezoelectric layer 6A is not limited to $LiTaO_3$ (lithium tantalate) and may be, for example, $LiNbO_3$ (lithium niobate). When the piezoelectric layer 6A is made of, for example, the Y-cut X-propagation $LiNbO_3$ piezoelectric single crystal or piezoelectric ceramic, each first acoustic wave resonator 3A can use, as the main mode, the mode including the SH wave as the main component by using a Love wave as the acoustic wave. Note that the single crystal material and the cut angle of the piezoelectric layer 6A may be appropriately determined according to, for example, required specifications (filter characteristics such as band-pass characteristics, attenuation characteristics, temperature characteristics, and a band width) of a filter.

(2.1.4) IDT Electrode

Figure 4A:
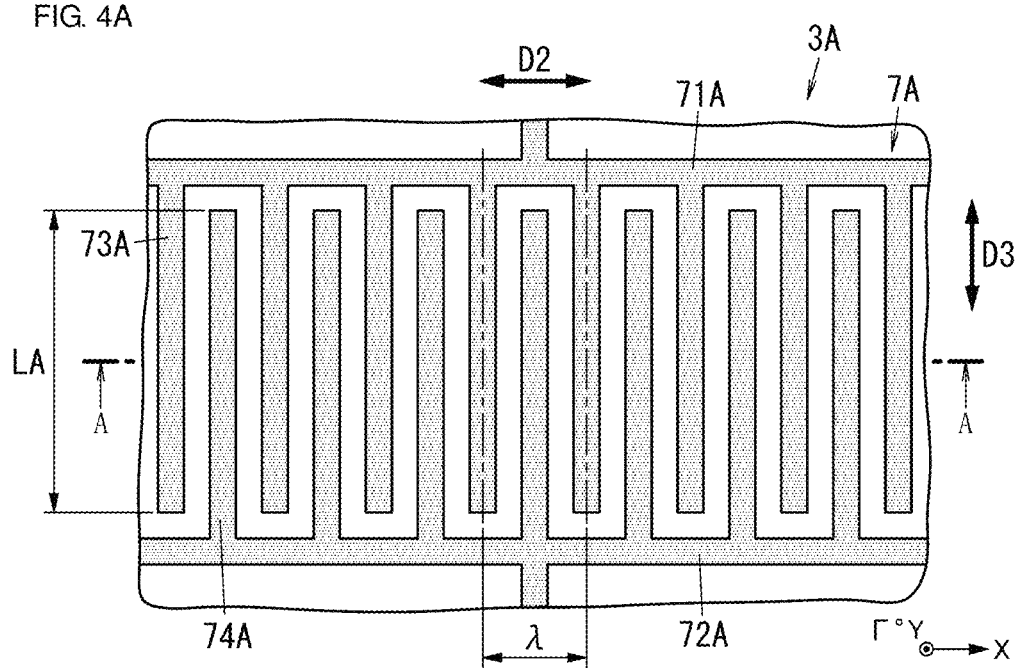
FIG. 4A is a plan view of a main portion of the first acoustic wave resonator in the above-described acoustic wave device.
Figure 4B:
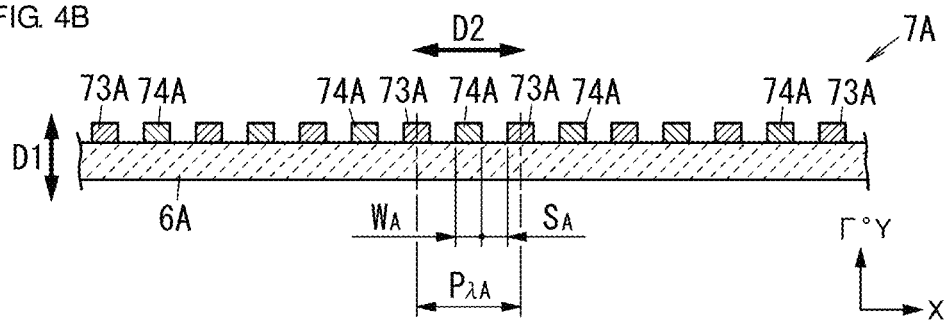
FIG. 4B illustrates the first acoustic wave resonator in the above-described acoustic wave device and is a cross-sectional view taken along line A-A of FIG. 4A.

As illustrated in FIGS. 4A and 4B, the IDT electrode 7A includes a first busbar 71A, a second busbar 72A, the plurality of first electrode fingers 73A, and the plurality of second electrode fingers 74A and is provided on a main surface 61A of the piezoelectric layer 6A.

The first busbar 71A has an elongated shape in the longitudinal direction which is a second direction D2, and is electrically connected to the plurality of first electrode fingers 73A. The second busbar 72A has an elongated shape in the longitudinal direction which is the second direction D2, and is electrically connected to the plurality of second electrode fingers 74A. The second direction D2 is a direction orthogonal or substantially orthogonal to the first direction D1.

The plurality of first electrode fingers 73A are side by side in the second direction D2. Each first electrode finger 73A has an elongated shape in the longitudinal direction which is a third direction D3. The plurality of first electrode fingers 73A are in parallel or substantially in parallel to each other in a state of opposing each other in the second direction D2. The plurality of second electrode fingers 74A are side by side in the second direction D2. Each second electrode finger 74A has an elongated shape in the longitudinal direction which is the third direction D3. The plurality of second electrode fingers 74A are in parallel or substantially in parallel to each other in a state of opposing each other in the second direction D2. In the present preferred embodiment, the plurality of first electrode fingers 73A and the plurality of second electrode fingers 74A are alternately arranged one by one. The third direction D3 is a direction orthogonal or substantially orthogonal to both the first direction D1 and the second direction D2.

When the width of the first electrode fingers 73A and the second electrode fingers 74A is $W_A$ (see FIG. 4B) and a space width between the first electrode finger 73A and the second electrode finger 74A adjacent to each other is $S_A$, a duty ratio in the IDT electrode 7A is defined by $W_A/(W_A+S_A)$. The duty ratio of the IDT electrode 7A is preferably, for example, 0.5. When the wavelength of the acoustic wave, which is determined by the electrode finger cycle of the IDT electrode 7A, is λ, the wavelength λ is equal to the electrode finger cycle. The electrode finger cycle is defined by a repetition cycle $P_{\lambda A}$ (see FIG. 4B) of the plurality of first electrode fingers 73A or the plurality of second electrode fingers 74A. Accordingly, the repetition cycle $P_{\lambda A}$ and λ are equal to each other. The duty ratio of the IDT electrode 7A is a ratio of the width $W_A$ of the first electrode fingers 73A and the second electrode fingers 74A relative to a half value $(W_A+S_A)$ of the electrode finger cycle.

The IDT electrode 7A is made of an appropriate metal material such as, for example, Al, Cu, Pt, Au, Ag, Ti, Ni, Cr, Mo, W, and an alloy including any one of these metals as a main component. Further, the IDT electrode 7A may have a structure in which a plurality of metal films made of these metals or alloys are laminated.

(2.2) Second Acoustic Wave Resonator

As illustrated in FIG. 1, the acoustic wave resonators other than the first acoustic wave resonators 3A among the plurality of acoustic wave resonators 31 to 39 are second acoustic wave resonators 3B. In the example of FIG. 1, the plurality of acoustic wave resonators 33 to 39 is the second acoustic wave resonators 3B.

Figure 3B:
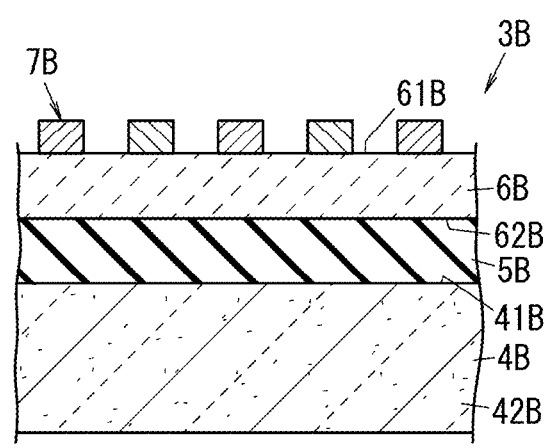
FIG. 3B is a cross-sectional view of a second acoustic wave resonator in the above-described acoustic wave device.

As illustrated in FIG. 3B, each second acoustic wave resonator 3B includes a high-acoustic-velocity member 4B, a low-acoustic-velocity film 5B, a piezoelectric layer 6B, and an IDT electrode 7B.

(2.2.1) High-Acoustic-Velocity Member

The high-acoustic-velocity member 4B in the present preferred embodiment is a high-acoustic-velocity support substrate 42B. The high-acoustic-velocity support substrate 42B is located on a side opposite to the IDT electrode 7B with the piezoelectric layer 6B interposed therebetween. In the high-acoustic-velocity support substrate 42B, the acoustic velocity of the bulk wave propagating in the high-acoustic-velocity support substrate 42B is higher than the acoustic velocity of the acoustic wave propagating in the piezoelectric layer 6B. The high-acoustic-velocity support substrate 42B supports the low-acoustic-velocity film 5B, the piezoelectric layer 6B, and the IDT electrode 7B.

The high-acoustic-velocity support substrate 42B confines the acoustic wave to a portion where the piezoelectric layer 6B and the low-acoustic-velocity film 5B are laminated and prevents the acoustic wave from leaking to the lower side of the high-acoustic-velocity support substrate 42B.

A material of the high-acoustic-velocity support substrate 42B is preferably, for example, silicon, and the thickness of the high-acoustic-velocity support substrate 42B is preferably, for example, about 125 μm. Note that the material of the high-acoustic-velocity support substrate 42B is not limited to silicon and may be a piezoelectric material such as, for example, aluminum nitride, aluminum oxide, silicon carbide, silicon nitride, sapphire, lithium tantalate, lithium niobate, and quartz, various ceramics such as alumina, zirconia, cordierite, mullite, steatite, and forsterite, magnesia, diamond, a material including any of these materials as a main component, or a material including a mixture of the above-described materials as a main component.

(2.2.2) Low-Acoustic-Velocity Film

The low-acoustic-velocity film 5B is a film in which the acoustic velocity of the bulk wave propagating in the low-acoustic-velocity film 5B is lower than the acoustic velocity of the bulk wave propagating in the piezoelectric layer 6B. The low-acoustic-velocity film 5B is provided between the high-acoustic-velocity support substrate 42B and the piezoelectric layer 6B. Since the low-acoustic-velocity film 5B is provided between the high-acoustic-velocity support substrate 42B and the piezoelectric layer 6B, the acoustic velocity of the acoustic wave decreases. Energy of the acoustic wave inherently concentrates on a medium having a low acoustic velocity. Therefore, an effect of confining the energy of the acoustic wave in the piezoelectric layer 6B and in the IDT electrode 7B in which the acoustic wave is excited can be improved. As a result, as in the case of the first acoustic wave resonator 3A (see FIG. 3A), loss can be reduced and a Q value can be increased as compared with the case where the low-acoustic-velocity film 5B is not provided.

A material of the low-acoustic-velocity film 5B is preferably, for example, silicon oxide. Note that the material of the low-acoustic-velocity film 5B is not limited to silicon oxide and may be, for example, glass, silicon oxynitride, tantalum oxide, a compound obtained by adding fluorine, carbon, or boron to silicon oxide, or a material including any of the above-described materials as a main component.

When the material of the low-acoustic-velocity film 5B is silicon oxide, temperature characteristics can be improved. The elastic constant of $LiTaO_3$ which is a material of the piezoelectric layer 6B has negative temperature characteristics whereas silicon oxide has positive temperature characteristics. Therefore, in the acoustic wave device 1, an absolute value of the TCF can be reduced. Further, the intrinsic acoustic impedance of silicon oxide is smaller than the intrinsic acoustic impedance of $LiTaO_3$ which is the material of the piezoelectric layer 6B. It is therefore possible to achieve both increase in an electromechanical coupling coefficient, that is, expansion of a specific band and improvement in the frequency temperature characteristics.

It is preferable that the thickness of the low-acoustic-velocity film 5B is, for example, equal to or less than about 2.0λ where the wavelength of the acoustic wave, which is determined by a cycle of electrode fingers (first electrode fingers 73B and second electrode fingers 74B as will be described later) of the IDT electrode 7B, is λ. By setting the thickness of the low-acoustic-velocity film 5B to be equal to or less than about 2.0λ, film stress can be reduced, and as a result, warpage of wafer can be reduced. Therefore, improvement in a yield rate and stabilization of the characteristics can be achieved. When the thickness of the low-acoustic-velocity film 5B is in a range of equal to or more than 0.1λ and equal to or less than about 0.5λ, for example, the electromechanical coupling coefficient is hardly changed.

(2.2.3) Piezoelectric Layer

Similarly to the piezoelectric layer 6A, the piezoelectric layer 6B is preferably made of, for example, the Γ° Y-cut X-propagation LiTaO$_3$ piezoelectric single crystal. The cut angle of the piezoelectric layer 6B is Γ=θ+90° where the cut angle is Γ [°] and the Euler angles of the piezoelectric layer 6B are (φ, θ, ψ) The piezoelectric layer 6B is not limited to the Γ° Y-cut X-propagation LiTaO$_3$ piezoelectric single crystal, and may be, for example, Γ° Y-cut X-propagation LiTaO$_3$ piezoelectric ceramic.

The piezoelectric layer 6B is laminated directly or indirectly on the low-acoustic-velocity film 5B. The thickness of the piezoelectric layer 6B in the thickness direction (first direction D1) of the high-acoustic-velocity support substrate 42B is preferably, for example, equal to or less than about 3.5λ. When the thickness of the piezoelectric layer 6B is equal to or less than about 3.5λ, for example, the Q value increases. Further, by setting the thickness of the piezoelectric layer 6B to be equal to or less than about 2.5λ, for example, the TCF can be decreased. Moreover, by setting the thickness of the piezoelectric layer 6B to be equal to or less than about 1.5λ, for example, it is easy to adjust the acoustic velocity of the acoustic wave.

In each of the second acoustic wave resonators 3B in the acoustic wave device 1, as a mode of the acoustic wave propagating in the piezoelectric layer 6B, a longitudinal wave, an SH wave, an SV wave, and a mode in which these waves are combined are considered. In the second acoustic wave resonator 3B, a mode including the SH wave as a main component is used as a main mode. A higher-order mode is a spurious emission mode that is generated on the higher frequency side than the main mode of the acoustic wave propagating in the piezoelectric layer 6B. As for the mode of the acoustic wave propagating in the piezoelectric layer 6B, whether or not "the mode containing the SH wave as the main component is used as the main mode" can be checked by analyzing displacement distribution with the finite element method by using, for example, parameters (material, Euler angles, thickness, and the like) of the piezoelectric layer 6B, parameters (material, thickness, electrode finger cycle, and the like) of the IDT electrode 7B, and parameters (material, thickness, and the like) of the low-acoustic-velocity film 5B, and analyzing strain. The Euler angles of the piezoelectric layer 6B can be obtained by analysis.

The material of the piezoelectric layer 6B is not limited to LiTaO$_3$ and may be, for example, LiNbO$_3$. When the piezoelectric layer 6B is made of, for example, the Y-cut X-propagation LiNbO$_3$ piezoelectric single crystal or piezoelectric ceramic, the second acoustic wave resonator 3B can use, as the main mode, the mode including the SH wave as the main component by using the Love wave as the acoustic wave. Note that the single crystal material and the cut angle of the piezoelectric layer 6B may be appropriately determined according to, for example, required specifications (filter characteristics such as bandpass characteristics, attenuation characteristics, temperature characteristics, and a band width) of a filter.

(2.2.4) IDT Electrode

Figure 5A:
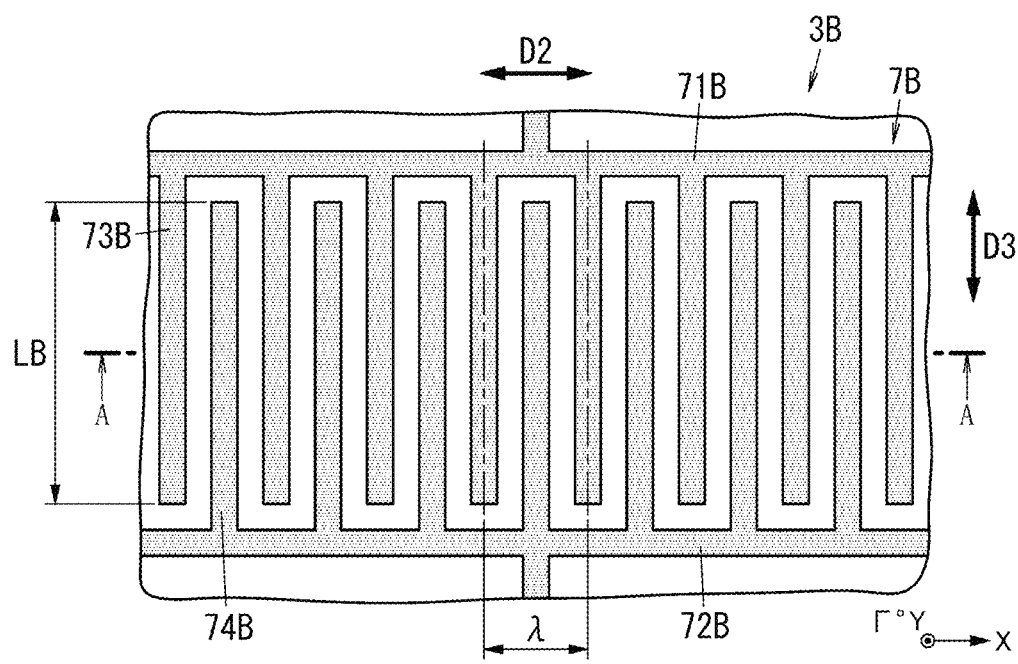
FIG. 5A is a plan view of a main portion of the second acoustic wave resonator in the above-described acoustic wave device.
Figure 5B:
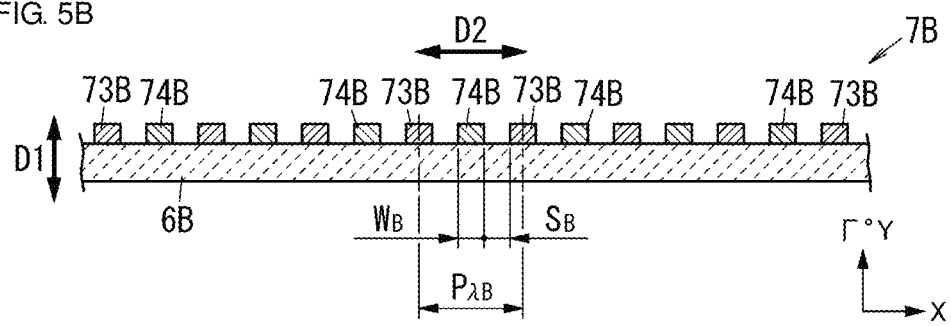
FIG. 5B illustrates the second acoustic wave resonator in the above-described acoustic wave device and is a cross-sectional view taken along line A-A of FIG. 5A.

Similarly to the IDT electrode 7A, as illustrated in FIGS. 5A and 5B, the IDT electrode 7B includes a first busbar 71B, a second busbar 72B, a plurality of first electrode fingers 73B, and a plurality of second electrode fingers 74B, and is provided on a main surface 61B (see FIG. 3B) of the piezoelectric layer 6B.

Similarly to the first busbar 71A, the first busbar 71B has an elongated shape in the longitudinal direction which is the second direction D2, and is electrically connected to the plurality of first electrode fingers 73B. Similarly to the second busbar 72A, the second busbar 72B has an elongated shape in the longitudinal direction which is the second direction D2, and is electrically connected to the plurality of second electrode fingers 74B.

The plurality of first electrode fingers 73B are side by side in the second direction D2. Each first electrode finger 73B has an elongated shape in the longitudinal direction which is a third direction D3. The plurality of first electrode fingers 73B are in parallel or substantially in parallel to each other in a state of opposing each other in the second direction D2. The plurality of second electrode fingers 74B are side by side in the second direction D2. Each second electrode finger 74B has an elongated shape in the longitudinal direction which is the third direction D3. The plurality of second electrode fingers 74B are in parallel or substantially in parallel to each other in a state of opposing each other in the second direction D2. In the present preferred embodiment, the plurality of first electrode fingers 73B and the plurality of second electrode fingers 74B are alternately arranged one by one.

When the width of the first electrode fingers 73B and the second electrode fingers 74B is $W_B$ (see FIG. 5B) and a space width between the first electrode finger 73B and the second electrode finger 74B adjacent to each other is $S_B$, a duty ratio in the IDT electrode 7B is defined by $W_B/(W_B+S_B)$. The duty ratio of the IDT electrode 7B is preferably, for example, about 0.5. When the wavelength of the acoustic wave, which is determined by the electrode finger cycle of the IDT electrode 7B, is λ, the wavelength λ is equal to the electrode finger cycle. The electrode finger cycle is defined by a repetition cycle $P_{\lambda B}$ (see FIG. 5B) of the plurality of first electrode fingers 73B or the plurality of second electrode fingers 74B. Accordingly, the repetition cycle $P_{\lambda B}$ and λ are equal to each other. The duty ratio of the IDT electrode 7B is a ratio of the width $W_B$ of the first electrode fingers 73B and the second electrode fingers 74B relative to a half value $(W_B+S_B)$ of the electrode finger cycle.

The IDT electrode 7B is made of an appropriate metal material such as, for example, Al, Cu, Pt, Au, Ag, Ti, Ni, Cr, Mo, W, and an alloy including any one of these metals as a main component. Further, the IDT electrode 7B may have a structure in which a plurality of metal films made of these metals or alloys are laminated.

(3) Cut Angle of Piezoelectric Layer in First Acoustic Wave Resonator and Second Acoustic Wave Resonator Next, a cut angle θ1 of the piezoelectric layer 6A in each first acoustic wave resonator 3A and a cut angle θ2 of the piezoelectric layer 6B in each second acoustic wave resonator 3B will be described. In the present preferred embodiment, the material of the piezoelectric layers 6A and 6B is LiTaO$_3$.

The cut angle θ1 of the piezoelectric layer 6A of the first acoustic wave resonator 3A is within a range of $\theta_B \pm 4°$ with reference to a cut angle $\theta_B$ obtained by the following equation (1). That is, the cut angle θ1 is a value satisfying a relation of $\theta_B-4°\leq\theta1\leq\theta_B+4°$. In the equation (1), the wavelength of the first acoustic wave resonator 3A is λ (μm), the thickness of the IDT electrode 7A of the first acoustic wave resonator 3A is $T_{IDT}$(μm), the specific gravity of the IDT electrode 7A is ρ (g/cm³), the duty ratio which is a value obtained by dividing the width of the first electrode fingers 73A and the second electrode fingers 74A of the IDT electrode 7A by the electrode finger cycle is Du, the thickness of the piezoelectric layer 6A of the first acoustic wave resonator 3A is $T_{LT}$ (μm), and the thickness of the low-acoustic-velocity film 5A of the first acoustic wave resonator 3A is $T_{VL}$ (μm). The cut angle $\theta_B$ is a preferable or optimal cut angle of the piezoelectric layer 6A at which the spurious emission of the Rayleigh wave is reduced or minimized.

$$\theta_B = 43.09 - 27.5 \times \left(\frac{T_{IDT}}{\lambda} \times \rho - 0.1956\right) - 19.2 \times (D_u - 0.5) +$$
$$17.4578 \times \left(\frac{T_{LT}}{\lambda} - 0.35\right) + 5.619 \times \left(\frac{T_{VL}}{\lambda} - 0.3\right) +$$
$$32.66 \times \left\{\left(\frac{T_{LT}}{\lambda} - 0.35\right)^2 - 0.0125\right\} +$$
$$24.63 \times \left(\frac{T_{LT}}{\lambda} - 0.35\right) \times \left(\frac{T_{VL}}{\lambda} - 0.3\right)$$

Equation (1)

Regarding each first acoustic wave resonator 3A of the acoustic wave device 1 according to the present preferred embodiment, the cut angle θ1 at which generation of the spurious emission of the Rayleigh wave in an attenuation band on the lower frequency side than the pass band can be reduced or prevented varies depending on the wavelength λ, the thickness $T_{IDT}$, the specific gravity ρ, the duty ratio Du, the thickness $T_{LT}$, and the thickness $T_{VL}$, and is an angle defined by the equation (1).

On the other hand, the cut angle θ2 of the piezoelectric layer 6B of each second acoustic wave resonator 3B has a larger difference from the cut angle $\theta_B$ rather than the cut angle θ1 of the piezoelectric layer 6A of the first acoustic wave resonator 3A. That is, an absolute value difference |θ2−$\theta_B$| of the cut angle in the piezoelectric layer 6B of the second acoustic wave resonator 3B is larger than an absolute value difference |θ1−$\theta_B$| of the cut angle in the piezoelectric layer 6A of the first acoustic wave resonator 3A. In this case, in the equation (1), the wavelength λ is the wavelength of the second acoustic wave resonator 3B, the thickness $T_{IDT}$ (μm) is the thickness of the IDT electrode 7B of the second acoustic wave resonator 3B, the specific gravity ρ (g/cm³) is the specific gravity of the IDT electrode 7B, the duty ratio Du is the value obtained by dividing the width of the first electrode fingers 73B and the second electrode fingers 74B of the IDT electrode 7B by the electrode finger cycle, the thickness $T_{LT}$ (μm) is the thickness of the piezoelectric layer 6B of the second acoustic wave resonator 3B, and the thickness $T_{VL}$(μm) is the thickness of the low-acoustic-velocity film 5B of the second acoustic wave resonator 3B. The cut angle $\theta_B$ is a preferable or optimal cut angle of the piezoelectric layer 6B at which the spurious emission of the Rayleigh wave is reduced or minimized.

(4) Operating Principle of Acoustic Wave Device

Next, an operation principle of the acoustic wave device 1 according to the present preferred embodiment will be described. In the present preferred embodiment, the acoustic wave device 1 is the ladder filter.

For example, each of the parallel arm resonators (acoustic wave resonators 32, 34, 36, and 38) illustrated in FIG. 1 has a resonant frequency frp and an anti-resonant frequency fap (>frp) in resonance characteristics. Further, each of the series arm resonators (acoustic wave resonators 31, 33, 35, 37, and 39) has a resonant frequency frs and an anti-resonant frequency fas (>frs>frp) in resonance characteristics. Note that the resonant frequencies frs of the acoustic wave resonators 31, 33, 35, 37, and 39 are designed to match with each other, but do not necessarily need to completely match with each other. The same applies to the anti-resonant frequencies fas of the acoustic wave resonators 31, 33, 35, 37, and 39, the resonant frequencies frp of the acoustic wave resonators 32, 34, 36, and 38, and the anti-resonant frequencies fap of the acoustic wave resonators 32, 34, 36, and 38, and they do not necessarily need to completely match with each other.

In the case of the ladder filter such as the acoustic wave device 1, the anti-resonant frequencies fap of the parallel arm resonators (acoustic wave resonators 32, 34, 36, and 38) and the resonant frequencies frs of the series arm resonators (acoustic wave resonators 31, 33, 35, 37, and 39) are close to each other. Accordingly, the vicinity of the resonant frequencies frp at which the impedances of the acoustic wave resonators 32, 34, 36, and 38 approach 0 is a low-frequency-side blocking region. When the frequency is increased, the impedances of the acoustic wave resonators 32, 34, 36, and 38 become higher in the vicinity of the anti-resonance frequencies fap, and the impedances of the acoustic wave resonators 31, 33, 35, 37, and 39 approach 0 in the vicinity of the resonant frequencies frs. Accordingly, the vicinity of a range between the anti-resonant frequencies fap and the resonant frequencies frs is a pass band on the first path r1 from the first terminal 101 to the second terminal 102. When the frequency is further increased to the vicinity of the anti-resonant frequencies fas, the impedances of the acoustic wave resonators 31, 33, 35, 37, and 39 increase. The vicinity of the anti-resonant frequencies fas is a high-frequency-side blocking region. That is, the steepness of the attenuation characteristics in the high-frequency-side blocking region is greatly influenced by values of the anti-resonant frequencies fas of the acoustic wave resonators 31, 33, 35, 37, and 39, which are set outside the signal pass band.

In the acoustic wave device 1, when a high-frequency signal is input from the first terminal 101, a potential difference is generated between the first terminal 101 and the ground. The potential difference causes strain of the piezoelectric layers 6A to generate the surface acoustic wave propagating in the X-direction (see FIGS. 4A, 4B, 5A, and 5B). By making the wavelength λ of the IDT electrodes 7A match with the wavelength of the pass band, the acoustic wave device 1 transmits only high-frequency signals having frequency components that are desired to pass therethrough.

Figure 6:
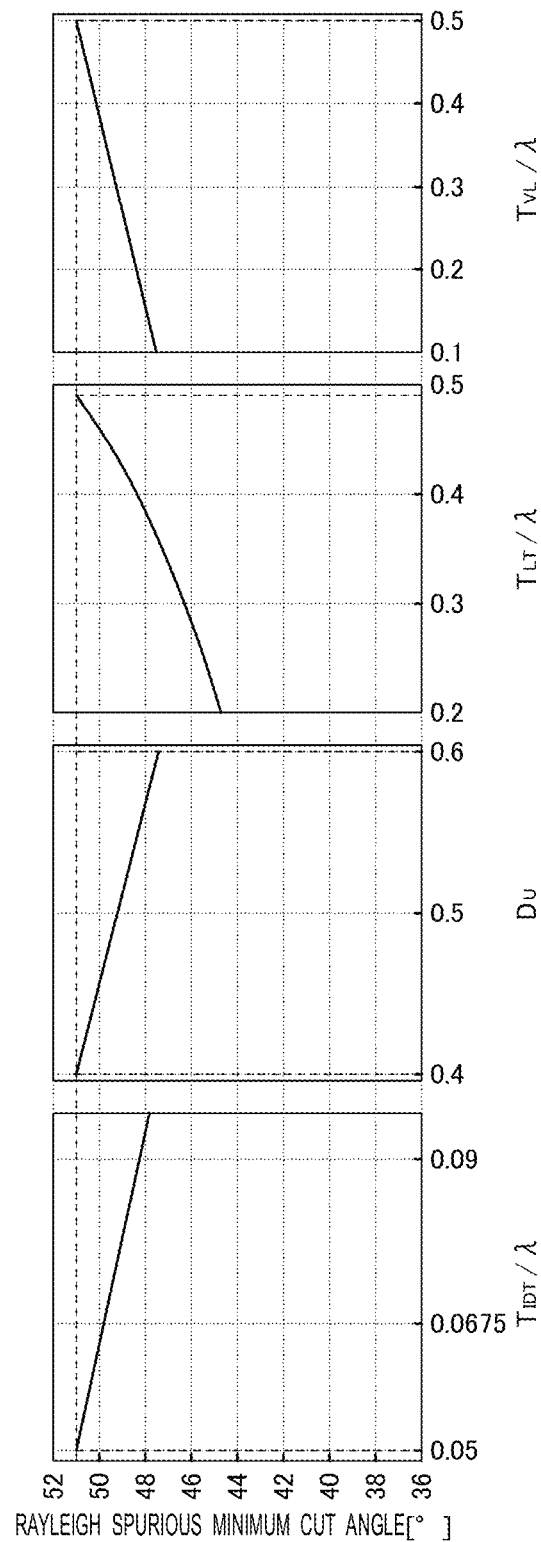
FIG. 6 is a graph illustrating a relationship between structural parameters in a first range and a cut angle of a piezoelectric layer in the first acoustic wave resonator of the above-described acoustic wave device.
Figure 7:
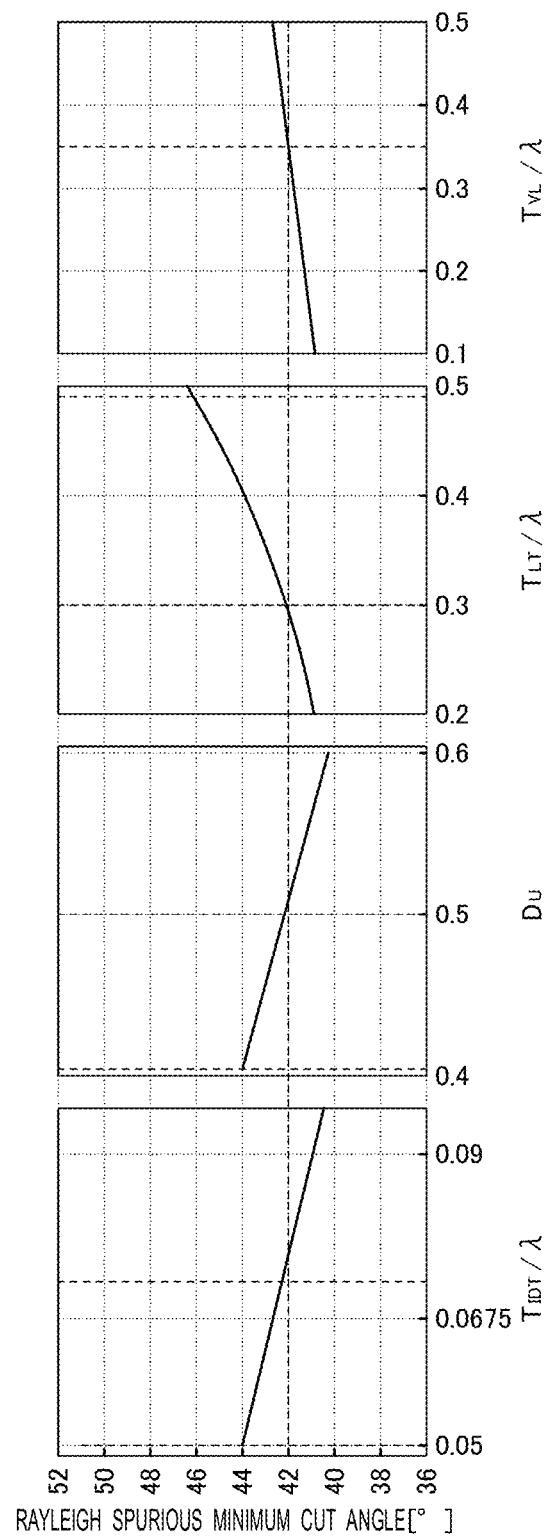
FIG. 7 is a graph illustrating a relationship between the structural parameters in a second range and the cut angle of the piezoelectric layer in the first acoustic wave resonator of the above-described acoustic wave device.
Figure 8:
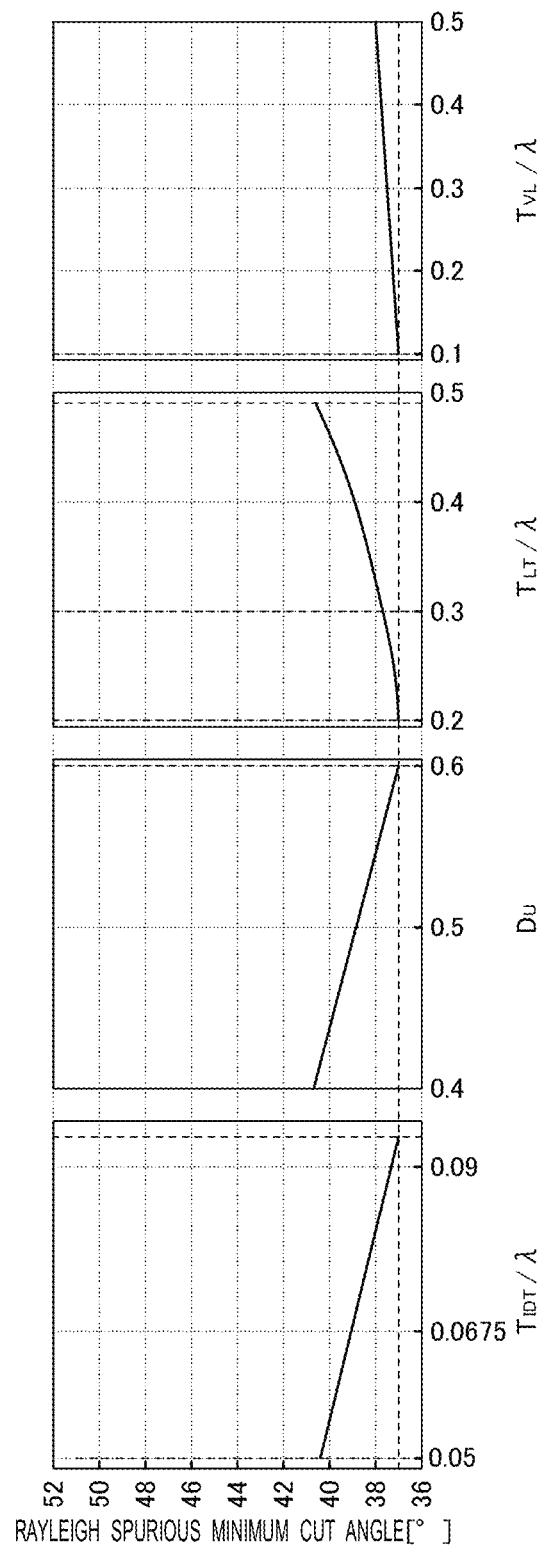
FIG. 8 is a graph illustrating a relationship between the structural parameters in a third range and the cut angle of the piezoelectric layer in the first acoustic wave resonator of the above-described acoustic wave device.

FIGS. 6 to 8 illustrate variations in the cut angle at which the spurious emission of the Rayleigh wave is reduced or minimized when a normalized film thickness ($T_{IDT}/\lambda$), the duty ratio Du, a normalized thickness ($T_{LT}/\lambda$), and a normalized film thickness ($T_{VL}/\lambda$) are changed. Results illustrated in FIGS. 6 to 8 are values obtained by simulation using the finite element method. In the simulation described above, for example, Al is used as the material of the IDT electrode, and $SiO_2$ is used as the material of the low-acoustic-velocity film.

The structural parameters in the first range are defined by, for example, a range of the normalized film thickness ($T_{IDT}/\lambda$) that is smaller than the normalized film thicknesses ($T_{IDT}/\lambda$) in the second range and the third range while including the case in which the normalized film thickness ($T_{IDT}/\lambda$) is about 0.05, a range of the duty ratio Du that is smaller than the duty ratios Du in the second range and the third range while including the case in which the duty ratio Du is about 0.4038, a range of the normalized thickness ($T_{LT}/\lambda$) that is larger than the normalized thicknesses ($T_{LT}/\lambda$) in the second range and the third range while including the case in which the normalized thickness ($T_{LT}/\lambda$) is about 0.4923, and a range of the normalized film thickness ($T_{VL}/\lambda$) that is larger than the normalized film thicknesses ($T_{VL}/\lambda$) in the second range and the third range while including the case in which the normalized film thickness ($T_{VL}/\lambda$) is about 0.4949.

The structural parameters in the third range are defined by, for example, a range of the normalized film thickness ($T_{IDT}/\lambda$) that is larger than the normalized film thicknesses ($T_{IDT}/\lambda$) in the first range and the second range while including the case in which the normalized film thickness ($T_{IDT}/\lambda$) is about 0.09471, a range of the duty ratio Du that is larger than the duty ratios Du in the first range and the second range while including the case in which the duty ratio Du is about 0.5974, a range of the normalized thickness ($T_{LT}/\lambda$) that is smaller than the normalized thicknesses ($T_{LT}/\lambda$) in the first range and the second range while including the case in which the normalized thickness ($T_{LT}/\lambda$) is about 0.2058, and a range of the normalized thickness ($T_{VL}/\lambda$) that is smaller than the normalized thicknesses ($T_{VL}/\lambda$) in the first range and the second range while including the case in which the normalized thickness ($T_{VL}/\lambda$) is about 0.1077.

The structural parameters in the second range are defined by, for example, a range of the normalized film thickness ($T_{IDT}/\lambda$) that is larger than the normalized film thickness ($T_{IDT}/\lambda$) in the first range and is smaller than the normalized film thickness ($T_{IDT}/\lambda$) in the third range while including the case in which the normalized film thickness ($T_{IDT}/\lambda$) is about 0.0725, a range of the duty ratio Du that is larger than the duty ratio Du in the first range and is smaller than the duty ratio Du in the third range while including the case in which the duty ratio Du is about 0.5, a range of the normalized thickness ($T_{LT}/\lambda$) that is smaller than the normalized thickness ($T_{LT}/\lambda$) in the first range and is larger than the normalized thickness ($T_{LT}/\lambda$) in the third range while including the case in which the normalized thickness ($T_{LT}/\lambda$) is about 0.3, and a range of the normalized film thickness ($T_{VL}/\lambda$) that is smaller than the normalized film thickness ($T_{VL}/\lambda$) in the first range and is larger than the normalized film thickness ($T_{VL}/\lambda$) in the third range while including the case in which the normalized film thickness ($T_{VL}/\lambda$) is about 0.35.

In all of FIGS. 6 to 8, the cut angle is smaller as the normalized film thickness ($T_{IDT}/\lambda$) is larger. Further, the cut angle is smaller as the duty ratio Du is larger. The cut angle is larger as the normalized thickness ($T_{LT}/\lambda$) is larger. The cut angle is larger as the normalized film thickness ($T_{VL}/\lambda$) is larger.

As illustrated in FIG. 6, when the normalized film thickness ($T_{IDT}/\lambda$) is a small value (=about 0.05), the duty ratio Du is a small value (=about 0.4038), the normalized thickness ($T_{LT}/\lambda$) is a large value (=about 0.4923), and the normalized film thickness ($T_{VL}/\lambda$) is a large value (=about 0.4949) as the structure parameters in the first range, the cut angle of about 51° at which the spurious emission of the Rayleigh wave is reduced or minimized can be obtained.

As illustrated in FIG. 7, when the normalized film thickness ($T_{IDT}/\lambda$) is a value in a central area (=about 0.0725), the duty ratio Du is a value in a central area (=about 0.5), the normalized thickness ($T_{LT}/\lambda$) is a value in a central area (=about 0.3), and the normalized film thickness ($T_{VL}/\lambda$) is a value in a central area (=about 0.35) as the structure parameters in the second range, the cut angle of about 42° at which the spurious emission of the Rayleigh wave is reduced or minimized can be obtained.

As illustrated in FIG. 8, when the normalized film thickness ($T_{IDT}/\lambda$) is a large value (=about 0.09471), the duty ratio Du is a large value (=about 0.5974), the normalized thickness ($T_{LT}/\lambda$) is a small value (=about 0.2058), and the normalized film thickness ($T_{VL}/\lambda$) is a small value (=about 0.1077) as the structure parameters in the third range, the cut angle of about 37° at which the spurious emission of the Rayleigh wave is reduced or minimized can be obtained.

In the case of the ladder filter as in the acoustic wave device 1 according to the present preferred embodiment, each of the series arm resonators and the parallel arm resonators generates spurious emission in the frequency band of around 0.76 times. Therefore, spurious emission having a band width is generated between spurious emission corresponding to the resonance points (anti-resonance points) of the series arm resonators and spurious emission corresponding to the resonance points (anti-resonance points) of the parallel arm resonators.

Figure 9:
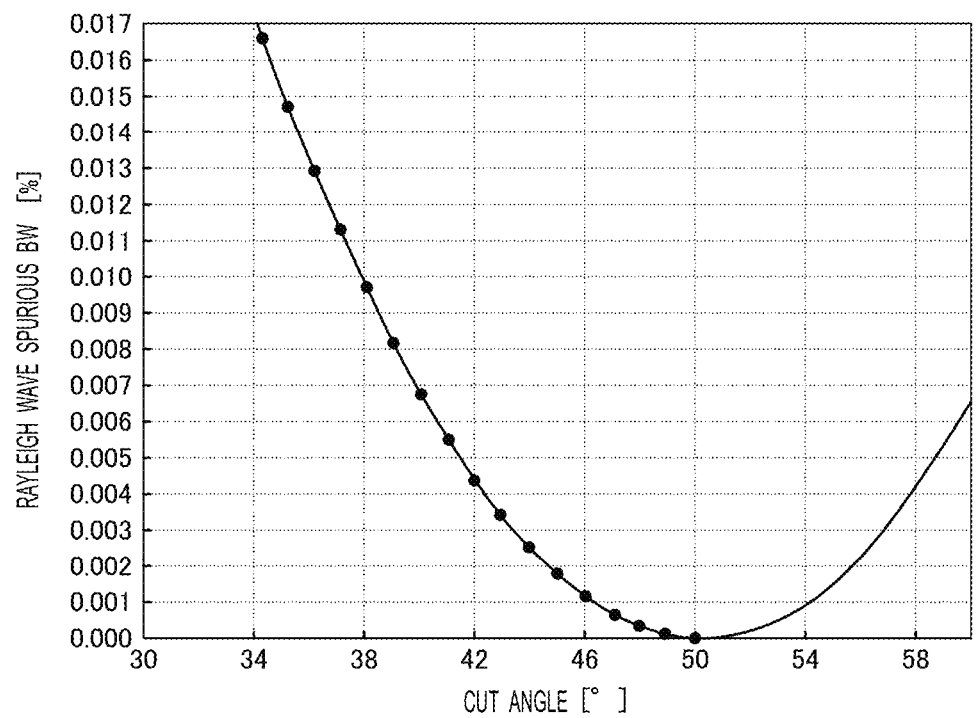
FIG. 9 is a graph illustrating a relationship between the cut angle of the piezoelectric layer and a band width of spurious emission of a Rayleigh wave with the structural parameters in the first range in the first acoustic wave resonator of the above-described acoustic wave device.

As illustrated in FIG. 9, when the normalized film thickness ($T_{IDT}/\lambda$) is the small value (=about 0.05), the duty ratio Du is the small value (=about 0.4038), the normalized thickness ($T_{LT}/\lambda$) is the large value (=about 0.4923), and the normalized film thickness ($T_{VL}/\lambda$) is the large value (=about 0.4949) as the structure parameters in the first range, the cut angle of about 50° at which a band width BW of the spurious emission of the Rayleigh wave is reduced or minimized can be obtained.

Figure 10:
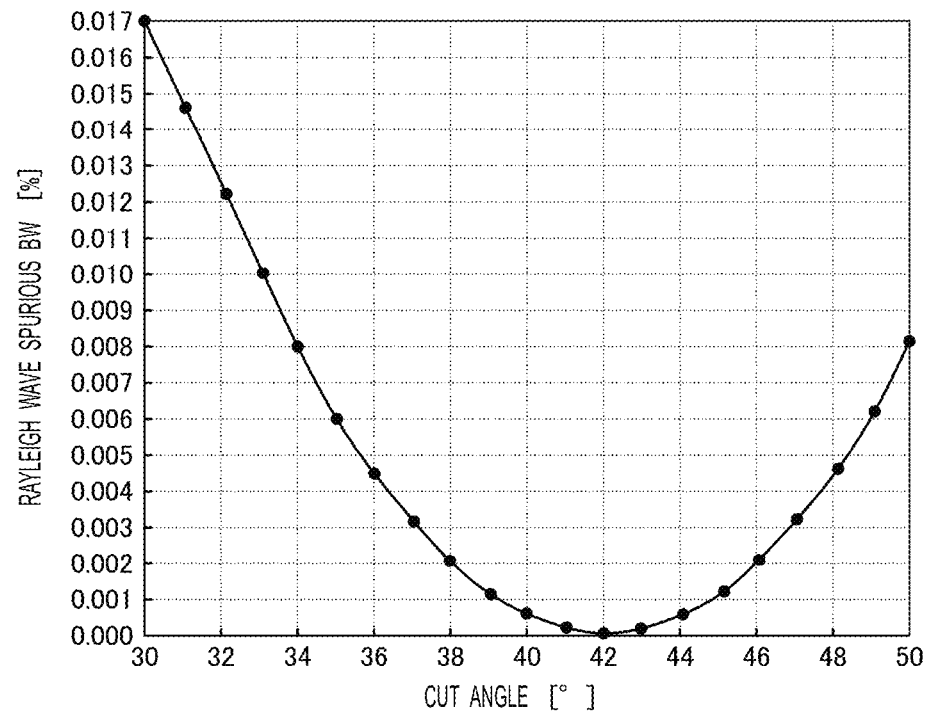
FIG. 10 is a graph illustrating a relationship between the cut angle of the piezoelectric layer and the band width of the spurious emission of the Rayleigh wave with the structural parameters in the second range in the first acoustic wave resonator of the above-described acoustic wave device.

As illustrated in FIG. 10, when the normalized film thickness ($T_{IDT}/\lambda$) is the value in the central area (=about 0.0725), the duty ratio Du is the value in the central area (=about 0.5), the normalized thickness ($T_{LT}/A$) is the value in the central area (=about 0.3), and the normalized film thickness ($T_{VL}/\lambda$) is the value in the central area (=about 0.35) as the structure parameters in the second range, the cut angle of about 42° at which the band width BW of the spurious emission of the Rayleigh wave is reduced or minimized can be obtained.

Figure 11:
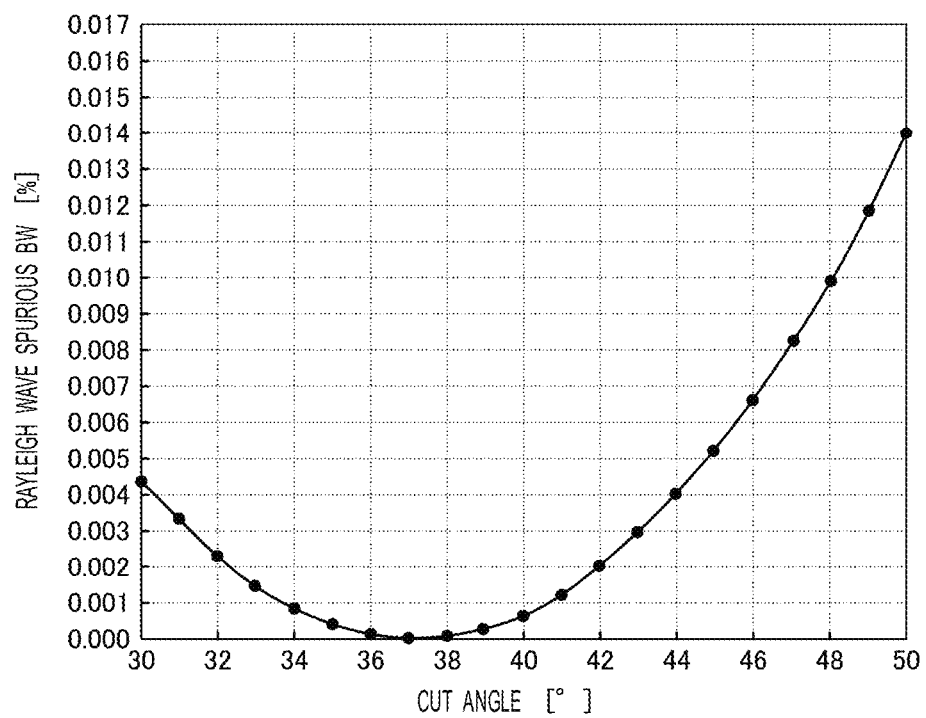
FIG. 11 is a graph illustrating a relationship between the cut angle of the piezoelectric layer and the band width of the spurious emission of the Rayleigh wave with the structural parameters in the third range in the first acoustic wave resonator of the above-described acoustic wave device.

As illustrated in FIG. 11, when the normalized film thickness ($T_{IDT}/\lambda$) is the large value (=about 0.09471), the duty ratio Du is the large value (=about 0.5974), the normalized thickness ($T_{LT}/\lambda$) is the small value (=about 0.2058), and the normalized film thickness ($T_{VL}/\lambda$) is the small value (=about 0.1077) as the structure parameters in the third range, the cut angle of about 37° at which the band width BW of the spurious emission of the Rayleigh wave is reduced or minimized can be obtained.

That is to say, as illustrated in FIGS. 6 to 8 and FIGS. 9 to 11, the cut angle at which the level and the band width of the spurious emission of the Rayleigh wave are reduced or minimized vary depending on combinations of the normalized film thickness ($T_{IDT}/\lambda$), the duty ratio Du, the normalized film thickness ($T_{LT}/\lambda$), and the normalized film thickness ($T_{VL}/\lambda$).

The above-described equation (1) is derived by analyzing, with a data analysis tool, pieces of data indicating relations between the normalized film thickness ($T_{IDT}/\lambda$), the duty ratio Du, the normalized thickness ($T_{LT}/\lambda$), and the normalized film thickness ($T_{VL}/\lambda$) and the cut angle $\theta_B$ at which the level and the band width BW of the spurious emission of the Rayleigh wave are reduced or minimized while including the pieces of data illustrated in FIGS. 6 to 11. That is, the cut angle $\theta_B$ varies with the thickness $T_{IDT}$, the duty ratio Du, the thickness $T_{LT}$, and the thickness $T_{VL}$. Therefore, the cut angle $\theta_B$ is not uniquely determined and is determined by the equation (1).

In the acoustic wave device 1 according to the present preferred embodiment, when the wavelength λ is about 1.3497 µm, the duty ratio Du is about 0.5, and the thickness $T_{IDT}$ of the IDT electrode 7A is about 141 nm, about 42° is derived as the optimal cut angle $\theta_B$ at which the spurious emission of the Rayleigh wave is minimized by substituting, into the equation (1), the normalized film thickness ($T_{LT}/\lambda$) of the piezoelectric layer 6A, the normalized film thickness ($T_{VL}/\lambda$) of the low-acoustic-velocity film 5A, and the specific gravity ρ of Al forming the IDT electrode 7A. Therefore, about 42° Y-cut X-propagation $LiTaO_3$ is desirably used as the piezoelectric layer 6A of the acoustic wave device 1 according to the preferred embodiment.

In the acoustic wave device 1 having the pass band on the high-frequency side, the cut angles θ1 of the piezoelectric layers 6A can be selected for the first acoustic wave resonators 3A including the antenna end resonator electrically closest to the antenna 200 by using the above-described equation (1). This makes it possible to reduce the spurious emission level of the Rayleigh wave to a value close to 0.

(5) Multiplexer

Next, a multiplexer 100 according to a preferred embodiment of the present invention will be described with reference to FIG. 2.

As illustrated in FIG. 2, the multiplexer 100 includes a first filter 11, a second filter 12, a third filter 21, and a fourth filter 22. Further, the multiplexer 100 includes the first terminal 101, the second terminal 102, a third terminal 103, a fourth terminal 104, and a fifth terminal 105.

The first terminal 101 is an antenna terminal that can be electrically connected to the antenna 200 outside of the multiplexer 100. The multiplexer 100 is connected to the antenna 200 with the first terminal 101 interposed therebetween. The first to fourth filters 11, 12, 21, and 22 are commonly connected to the first terminal 101.

The first filter 11 is a reception filter provided between the first terminal 101 and the second terminal 102. The first filter 11 transmits signals in a pass band of the first filter 11 and attenuates signals in bands other than the pass band.

The second filter 12 is a reception filter provided between the first terminal 101 and the third terminal 103. The second filter 12 transmits signals in a pass band of the second filter 12 and attenuates signals in bands other than the pass band.

The first filter 11 and the second filter 12 have pass bands that differ from each other. In the multiplexer 100, the pass band of the first filter 11 is in a lower frequency range than the pass band of the second filter 12. Therefore, in the multiplexer 100, a maximum frequency of the pass band of the first filter 11 is lower than a minimum frequency of the pass band of the second filter 12.

The third filter 21 is a transmission filter provided between the first terminal 101 and the fourth terminal 104. The third filter 21 transmits signals in a pass band of the third filter 21 and attenuates signals in bands other than the pass band.

The fourth filter 22 is a transmission filter provided between the first terminal 101 and the fifth terminal 105. The fourth filter 22 transmits signals in a pass band of the fourth filter 22 and attenuates signals in bands other than the pass band.

Note that inductors may be connected in series between the first to fourth filters 11, 12, 21, and 22 and the first terminal 101. The inductors are circuit elements that provide impedance matching between the antenna 200 and the first to fourth filters 11, 12, 21, and 22 and are not essential components.

In the first filter 11 which is the acoustic wave device 1, as described above, the cut angle θ1 of the piezoelectric layers 6A can be selected according to the structural parameters of the IDT electrodes 7A and the piezoelectric material of the piezoelectric layers 6A of the first acoustic wave resonators 3A (see FIG. 1), and the spurious emission of the Rayleigh wave in an attenuation band on the lower frequency side than the pass band of the first filter 11 can be reduced. Accordingly, for example, when the pass band of the second filter 12 on the lower frequency side than the pass band of the first filter 11 overlaps with the generation frequency of the spurious emission of the Rayleigh wave by the first filter 11, it is possible to reduce ripples in the pass band of the second filter 12.

(6) High-Frequency Front End Circuit

Next, a high-frequency front end circuit 300 according to a preferred embodiment of the present invention will be described with reference to FIG. 2.

As illustrated in FIG. 2, the high-frequency front end circuit 300 includes the multiplexer 100, a first switch circuit 301, a second switch circuit 302, a first amplifier circuit 303, and a second amplifier circuit 304.

The first switch circuit 301 is provided between the first filter 11 and the second filter 12 and the first amplifier circuit 303. The first switch circuit 301 includes two to-be-selected terminals individually connected to the second terminal 102 and the third terminal 103 of the multiplexer 100 and a common terminal connected to the first amplifier circuit 303. That is, the first switch circuit 301 is connected to the first filter 11 with the second terminal 102 interposed therebetween and is connected to the second filter 12 with the third terminal 103 interposed therebetween. The first switch circuit 301 switches the filter that is connected to the first amplifier circuit 303 between the first filter 11 and the second filter 12.

The first switch circuit 301 is preferably defined by, for example, a single pole double throw (SPDT)-type switch. The first switch circuit 301 is controlled by a control circuit (not illustrated). The first switch circuit 301 connects the common terminal and the to-be-selected terminal in accordance with a control signal from the control circuit. The first switch circuit 301 may be defined by, for example, a switch integrated circuit (IC). In the first switch circuit 301, the number of to-be-selected terminals that is connected to the common terminal is not limited to one and a plurality of terminals may be connected. That is, the high-frequency front end circuit 300 may be configured to support carrier aggregation.

The second switch circuit 302 is provided between the third filter 21 and the fourth filter 22 and the second amplifier circuit 304. The second switch circuit 302 includes two to-be-selected terminals individually connected to the fourth terminal 104 and the fifth terminal 105 of the multiplexer 100 and a common terminal connected to the second amplifier circuit 304. That is, the second switch circuit 302 is connected to the third filter 21 with the fourth terminal 104 interposed therebetween and is connected to the fourth filter 22 with the fifth terminal 105 interposed therebetween. The second switch circuit 302 switches the filter that is connected to the second amplifier circuit 304 between the third filter 21 and the fourth filter 22.

The second switch circuit 302 is preferably defined by, for example, the SPDT-type switch. The second switch circuit 302 is controlled by the above-described control circuit. The second switch circuit 302 connects the common terminal and the to-be-selected terminal in accordance with a control signal from the control circuit. The second switch circuit 302 may be defined by, for example, by the switch IC. In the second switch circuit 302, the number of to-be-selected terminals that is connected to the common terminal is not limited to one and a plurality of terminals may be connected.

The first amplifier circuit 303 amplifies a high-frequency signal (reception signal) that has passed through the antenna 200, the multiplexer 100, and the first switch circuit 301 and outputs the amplified high-frequency signal to the outside of the high-frequency front end circuit 300 (for example, an RF signal processing circuit 401, which will be described later). The first amplifier circuit 303 is a low-noise amplifier circuit.

The second amplifier circuit 304 amplifies a high-frequency signal (transmission signal) output from the outside of the high-frequency front end circuit 300 (for example, the RF signal processing circuit 401, which will be described later) and outputs the amplified high-frequency signal to the antenna 200 after passing through the second switch circuit 302 and the multiplexer 100. The second amplifier circuit 304 is a power amplifier circuit.

(7) Communication Apparatus

Next, a communication apparatus 400 according to a preferred embodiment of the present invention will be described with reference to FIG. 2.

As illustrated in FIG. 2, the communication apparatus 400 includes the high-frequency front end circuit 300, the RF signal processing circuit 401, and a baseband signal processing circuit 402. The RF signal processing circuit 401 and the baseband signal processing circuit 402 define a signal processing circuit that processes high-frequency signals.

The RF signal processing circuit 401 is preferably, for example, a radio frequency integrated circuit (RFIC) and performs signal processing on the high-frequency signals including transmission signals and reception signals. The RF signal processing circuit 401 performs signal processing such as down conversion, for example, on the high-frequency signal (reception signal) output from the first amplifier circuit 303 and outputs the high-frequency signal subjected to the signal processing to the baseband signal processing circuit 402.

The baseband signal processing circuit 402 is preferably, for example, a baseband integrated circuit (BBIC), and performs signal processing on each of a transmission signal from the outside and the high-frequency signal from the RF signal processing circuit 401.

(8) Advantageous Effects

As described above, in the acoustic wave device 1 according to the above-described preferred embodiment, the cut angle θ1 of the piezoelectric layers 6A of the first acoustic wave resonators 3A as the antenna end resonators which are electrically closest to the first terminal 101 connected to the antenna 200 are within the range of $\theta_B \pm 4°$. This makes it possible to reduce the spurious emission of the Rayleigh wave, which is generated on the lower frequency side than the pass band, while reducing or preventing the deterioration in the characteristics of the pass band.

In the acoustic wave device 1 according to the above-described preferred embodiment, the antenna end resonators are chips differing from the acoustic wave resonators other than the antenna end resonators among the plurality of acoustic wave resonators 31 to 39. With this configuration, variations in the characteristics of the acoustic wave resonators other than the antenna end resonators can be reduced or prevented.

In the acoustic wave device 1 according to the above-described preferred embodiment, the loss can be reduced and the Q value can be increased as compared with the case where the low-acoustic-velocity films 5A and 5B are not provided.

In the multiplexer 100 according to the above-described preferred embodiment, the acoustic wave device 1 is used for the first filter 11. With this configuration, influences on the second filter 12 by the spurious emission of the Rayleigh wave, which is generated in the first filter 11, can be reduced or prevented.

(9) Variations

Hereinafter, variations of preferred embodiments of the present invention will be described.

Figure 12:
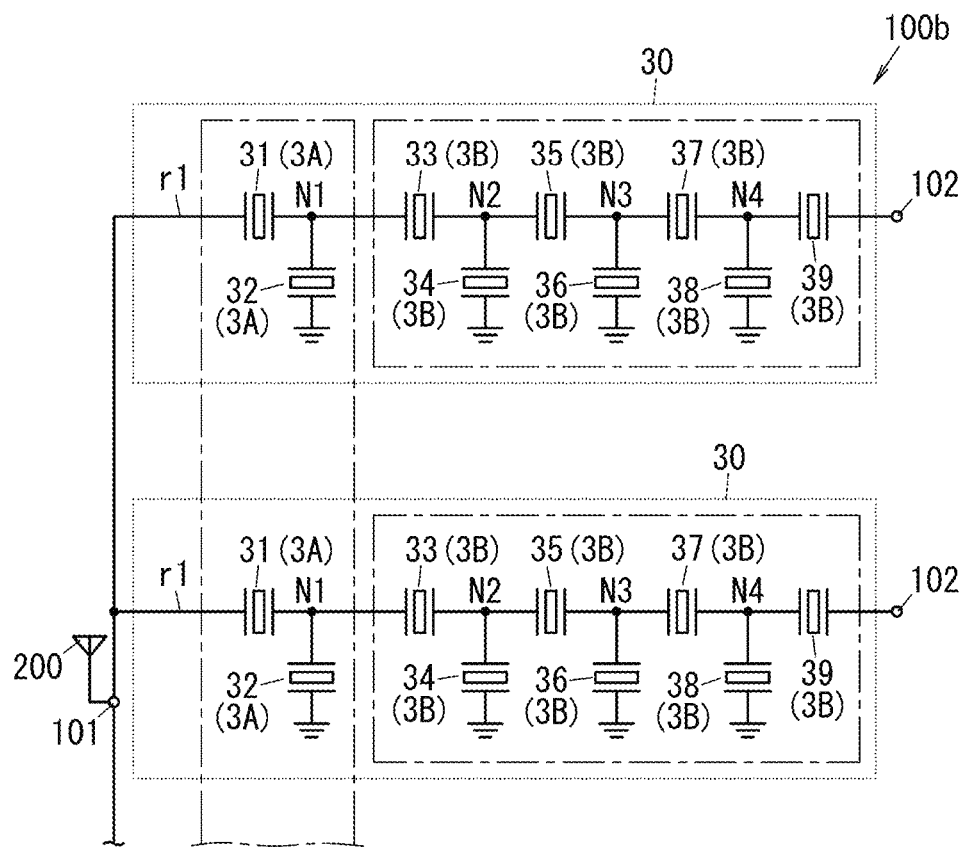
FIG. 12 is a circuit diagram of a multiplexer according to a first variation of a preferred embodiment of the present invention.

As illustrated in FIG. 12, a multiplexer 100b according to a first variation of a preferred embodiment includes a plurality of resonator groups 30 (only two resonator groups are illustrated in FIG. 12), each group being defined by the plurality of acoustic wave resonators 31 to 39. In the plurality of resonator groups 30, the first terminal 101 is a common terminal and the second terminals 102 are individual terminals. In the multiplexer 100b, the antenna end resonators (acoustic wave resonators 31) of the plurality of resonator groups 30 are integrated in one chip. Accordingly, the multiplexer 100b according to the first variation, which includes the configuration including the plurality of resonator groups 30, can be reduced in size and can be reduced in variations in characteristics of the antenna end resonators. In FIG. 12, the acoustic wave resonators surrounded by each alternate long and short dash line are integrated in one chip. For example, seven second acoustic wave resonators 3B in one resonator group 30 are integrated in one chip. In addition, two first acoustic wave resonators 3A of the respective resonator groups 30 (in the illustrated example, four first acoustic wave resonators 3A) are integrated in one chip. In the multiplexer 100b according to the first variation, the acoustic wave resonators 31 and 32 of the plurality of resonator groups 30 are integrated in one chip. It is however sufficient that at least the acoustic wave resonators 31 of the plurality of resonator groups 30 are integrated in one chip.

In the multiplexer 100b according to the first variation, the plurality of resonator groups 30 define filters having different pass bands.

In the multiplexer 100b according to the first variation, it is possible to reduce or prevent variations in characteristics of the antenna end resonators of the plurality of resonator groups 30 and reduce the size of the acoustic wave device 1.

Figure 13:
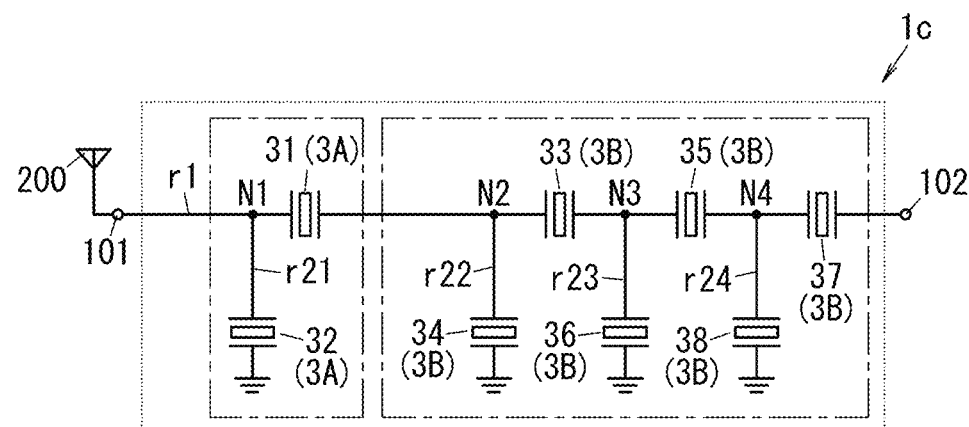
FIG. 13 is a circuit diagram of an acoustic wave device according to a second variation of a preferred embodiment of the present invention.

An acoustic wave device 1c according to a second variation of a preferred embodiment of the present invention differs from the acoustic wave device 1 according to the above-described preferred embodiment in a connection relationship among a plurality of (eight) acoustic wave resonators 31 to 38 as illustrated in FIG. 13. As for the acoustic wave device 1c according to the second variation, the same or similar components as those of the acoustic wave device 1 according to the above-described preferred embodiment are denoted by the same reference numerals, and the description thereof will be omitted.

In the acoustic wave device 1c, in the plurality of acoustic wave resonators 31 to 38, one series arm resonator (acoustic wave resonator 31) among a plurality of (four) series arm resonators (acoustic wave resonators 31, 33, 35, and 37) and one parallel arm resonator (acoustic wave resonator 32) among a plurality of (four) parallel arm resonators (acoustic wave resonators 32, 34, 36, and 38) are directly connected to the first terminal 101. The expression "one series arm resonator (acoustic wave resonator 31) is directly connected to the first terminal 101" means that it is electrically connected to the first terminal 101 without the other acoustic wave resonators 32 to 38 interposed therebetween. Further, the expression "one parallel arm resonator (acoustic wave resonator 32) is directly connected to the first terminal 101" means that it is electrically connected to the first terminal 101 without the other acoustic wave resonators 31 and 33 to 38 interposed therebetween.

In the acoustic wave device 1c, both of the one series arm resonator (acoustic wave resonator 31) and the one parallel arm resonator (acoustic wave resonator 32) are defined by the first acoustic wave resonators 3A as the antenna end resonators. However, they are not limited to being defined by the first acoustic wave resonators 3A. For example, in the acoustic wave device 1c, it is sufficient that the at least one of the one series arm resonator (acoustic wave resonator 31) and the one parallel arm resonator (acoustic wave resonator 32) is defined by the first acoustic wave resonator 3A as the antenna end resonator.

Figure 14A:
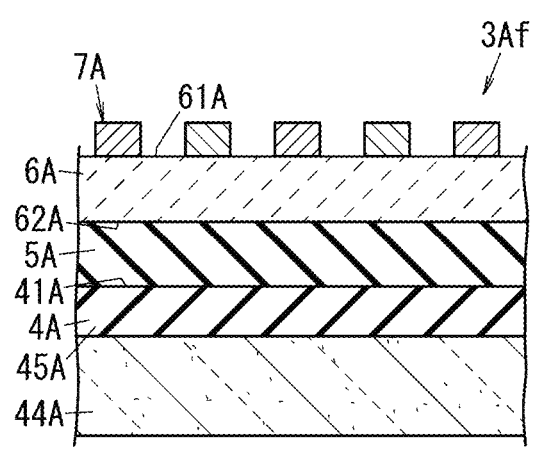
FIG. 14A is a cross-sectional view of a first acoustic wave resonator in an acoustic wave device according to a third variation of a preferred embodiment of the present invention.
Figure 14B:
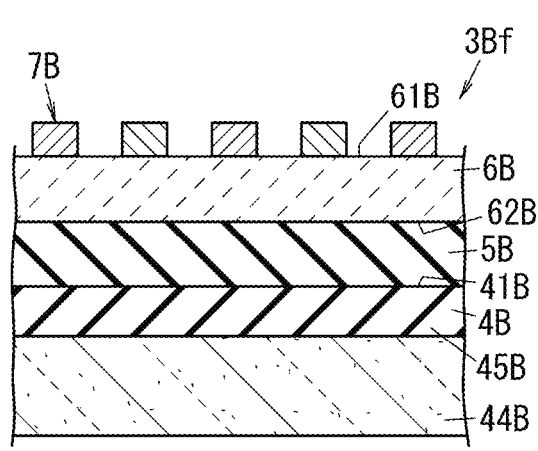
FIG. 14B is a cross-sectional view of a second acoustic wave resonator in the above-described acoustic wave device.

An acoustic wave device according to a third variation of a preferred embodiment of the present invention differs from the acoustic wave device 1 according to the above-described preferred embodiment in that it includes first acoustic wave resonators 3Af as illustrated in FIG. 14A and second acoustic wave resonators 3Bf as illustrated in FIG. 14B, instead of the first acoustic wave resonators 3A and the second acoustic wave resonators 3B of the acoustic wave device 1 according to the above-described preferred embodiment. As for the acoustic wave device according to the third variation, the same or similar components as those of the acoustic wave device 1 according to the first preferred embodiment are denoted by the same reference numerals, and the description thereof will be omitted.

The high-acoustic-velocity member 4A of each first acoustic wave resonator 3Af includes a high-acoustic-velocity film 45A and a support substrate 44A, instead of the high-acoustic-velocity support substrate 42A. The high-acoustic-velocity film 45A is provided on the support substrate 44A. The expression "provided on the support substrate 44A" includes the case where the high-acoustic-velocity film 45A is provided directly on the support substrate 44A and the case where the high-acoustic-velocity film 45A is provided indirectly on the support substrate 44A. In the high-acoustic-velocity film 45A, the acoustic velocity of the bulk wave propagating in the high-acoustic-velocity film 45A is higher than the acoustic velocity of the acoustic wave propagating in the piezoelectric layer 6A. The low-acoustic-velocity film 5A is provided on the high-acoustic-velocity film 45A. The expression "provided on the high-acoustic-velocity film 45A" includes the case where the low-acoustic-velocity film 5A is provided directly on the high-acoustic-velocity film 45A and the case where the low-acoustic-velocity film 5A is provided indirectly on the high-acoustic-velocity film 45A. In the low-acoustic-velocity film 5A, the acoustic velocity of the bulk wave propagating in the low-acoustic-velocity film 5A is lower than the acoustic velocity of the bulk wave propagating in the piezoelectric layer 6A. The piezoelectric layer 6A is provided on the low-acoustic-velocity film 5A. The expression "provided on the low-acoustic-velocity film 5A" includes the case where the piezoelectric layer 6A is provided directly on the low-acoustic-velocity film 5A and the case where the piezoelectric layer 6A is provided indirectly on the low-acoustic-velocity film 5A.

The high-acoustic-velocity member 4B of each second acoustic wave resonator 3Bf includes a high-acoustic-velocity film 45B and a support substrate 44B instead of the high-acoustic-velocity support substrate 42B. The high-acoustic-velocity member 4B is provided on the support substrate 44B. The expression "provided on the support substrate 44B" includes the case where the high-acoustic-velocity member 4B is provided directly on the support substrate 44B and the case where the high-acoustic-velocity member 4B is provided indirectly on the support substrate 44B. In the high-acoustic-velocity film 45B, the acoustic velocity of the bulk wave propagating in the high-acoustic-velocity film 45B is higher than the acoustic velocity of the acoustic wave propagating in the piezoelectric layer 6B. The low-acoustic-velocity film 5B is provided on the high-acoustic-velocity film 45B. The expression "provided on the high-acoustic-velocity film 45B" includes the case where the low-acoustic-velocity film 5B is provided directly on the high-acoustic-velocity film 45B and the case where the low-acoustic-velocity film 5B is provided indirectly on the high-acoustic-velocity film 45B. In the low-acoustic-velocity film 5B, the acoustic velocity of the bulk wave propagating in the low-acoustic-velocity film 5B is lower than the acoustic velocity of the bulk wave propagating in the piezoelectric layer 6B. The piezoelectric layer 6B is provided on the low-acoustic-velocity film 5B. The expression "provided on the low-acoustic-velocity film 5B" includes the case where the piezoelectric layer 6B is provided directly on the low-acoustic-velocity film 5B and the case where the piezoelectric layer 6B is provided indirectly on the low-acoustic-velocity film 5B.

A material of the support substrates 44A and 44B is preferably, for example, silicon. The material of the support substrates 44A and 44B is not limited to silicon and may be, for example, a piezoelectric material such as sapphire, lithium tantalate, lithium niobate, and quartz, various ceramics such as alumina, magnesia, silicon nitride, aluminum nitride, silicon carbide, zirconia, cordierite, mullite, steatite, and forsterite, a dielectric such as glass, a semiconductor such as gallium nitride, resin, or the like.

In the first acoustic wave resonator 3Af, the high-acoustic-velocity film 45A reduces or prevents energy of the acoustic wave in the main mode from leaking to the structure below the high-acoustic-velocity film 45A. Similarly, in the second acoustic wave resonator 3Bf, the high-acoustic-velocity film 45B reduces or prevents the energy of the acoustic wave in the main mode from leaking to the structure below the high-acoustic-velocity film 45B.

In the first acoustic wave resonator 3Af, when the thickness of the high-acoustic-velocity film 45A is sufficiently large, the energy of the acoustic wave in the main mode distributes throughout the piezoelectric layer 6A and the low-acoustic-velocity film 5A, also distributes to a portion of the high-acoustic-velocity film 45A on the low-acoustic-velocity film 5A side, and does not distribute to the support substrate 44A. Similarly, in the second acoustic wave resonator 3Bf, when the thickness of the high-acoustic-velocity film 45B is sufficiently large, the energy of the acoustic wave in the main mode distributes throughout the piezoelectric layer 6B and the low-acoustic-velocity film 5B, also distributes to a portion of the high-acoustic-velocity film 45B on the low-acoustic-velocity film 5B side, and does not distribute to the support substrate 44B. The mechanism of confining the acoustic wave by the high-acoustic-velocity films 45A and 45B is similar to that in the case of a Love wave-type surface acoustic wave, which is a non-leaking SH wave. The mechanism is described in, for example, "Introduction to simulation technologies for surface acoustic wave devices", Kenya Hashimoto, published by REALIZE Science & Engineering, pp. 26-28. The above-described mechanism is different from a mechanism of confining the acoustic wave using a Bragg reflector including an acoustic multilayer film.

The material of the high-acoustic-velocity films 45A and 45B is preferably, for example, at least one material selected from a group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond.

In the acoustic wave device according to the third variation, the high-acoustic-velocity members 4A and 4B include the high-acoustic-velocity films 45A and 45B, respectively. Accordingly, it is possible to reduce or prevent leakage of the acoustic wave to the support substrates 44A and 44B.

Further, as another variation of the above-described preferred embodiment of the present invention, the multiplexer 100 is not limited to a quadplexer defined by combining four filters. The multiplexer 100 may be a multiplexer defined by combining equal to or less than three filters or a multiplexer configured by combining equal to or more than five filters.

In the multiplexer 100, the acoustic wave device 1 or 1c according to the above-described preferred embodiment or the second or third variations may be applied not only to the first filter 11 but also to the second to fourth filters 12, 21, and 22.

The acoustic wave device 1c and the multiplexers 100 and 100b according to the above-described variations also provide the same or similar advantageous effects as those of the acoustic wave device 1 and the multiplexer 100 according to the above-described preferred embodiment.

The above-preferred embodiments and variations described above are only a portion of various preferred embodiments and variations of the present invention. Further, the above-described preferred embodiments and variations can be modified in various ways according to design and the like as long as the advantageous effects of the present invention can be achieved.

The following elements and features are disclosed by the preferred embodiments and variations described above.

An acoustic wave device (1; 1c) according to a preferred embodiment of the present invention is provided between a first terminal (101) as an antenna terminal and a second terminal (102) being different from the first terminal (101). The acoustic wave device (1; 1c) includes a plurality of acoustic wave resonators (31 to 39). The plurality of acoustic wave resonators (31 to 39) include a plurality of series arm resonators (acoustic wave resonators 31, 33, 35, 37, and 39) and a plurality of parallel arm resonators (acoustic wave resonators 32, 34, 36, and 38). The plurality of series arm resonators (acoustic wave resonators 31, 33, 35, 37, and 39) are provided on a first path (r1) connecting the first terminal (101) and the second terminal (102). The plurality of parallel arm resonators (acoustic wave resonators 32, 34, 36, and 38) are provided on a plurality of second paths connecting a plurality of nodes (N1, N2, N3, and N4) on the first path (r1) and ground, respectively. When an acoustic wave resonator that is electrically closest to the first terminal (101) among the plurality of acoustic wave resonators (31 to 39) is an antenna end resonator, the antenna end resonator is a first acoustic wave resonator (3A; 3Af). At least one acoustic wave resonator other than the antenna end resonator among the plurality of acoustic wave resonators (31 to 39) is a second acoustic wave resonator (3B; 3Bf). Each of the first acoustic wave resonator (3A; 3Af) and the second acoustic wave resonator (3B; 3Bf) includes a piezoelectric layer (6A; 6B), an IDT electrode (7A; 7B), a high-acoustic-velocity member (4A; 4B), and a low-acoustic-velocity film (5A; 5B). The IDT electrode (7A; 7B) is provided on the piezoelectric layer (6A; 6B) and includes a plurality of electrode fingers (first electrode fingers 73A and second electrode fingers 74A; first electrode fingers 73B and second electrode fingers 74B). The high-acoustic-velocity member (4A; 4B) is located on a side opposite to the IDT electrode (7A; 7B) with the piezoelectric layer (6A; 6B) interposed therebetween and in which an acoustic velocity of a bulk wave propagating in the high-acoustic-velocity member (4A; 4B) is higher than an acoustic velocity of an acoustic wave propagating in the piezoelectric layer (6A; 6B). The low-acoustic-velocity film (5A; 5B) is provided between the high-acoustic-velocity member (4A; 4B) and the piezoelectric layer (6A; 6B) and is a film in which an acoustic velocity of a bulk wave propagating in the low-acoustic-velocity film (5A; 5B) is lower than an acoustic velocity of a bulk wave propagating in the piezoelectric layer (6A; 6B). A thickness of the piezoelectric layer (6A; 6B) is equal to or less than about 3.5λ where a wavelength of an acoustic wave, which is determined by an electrode finger cycle as a cycle of the plurality of electrode fingers (first electrode fingers 73A and second electrode fingers 74A; first electrode fingers 73B and second electrode fingers 74B) of the IDT electrode (7A; 7B), is λ. A cut angle of the piezoelectric layer (6A) of the first acoustic wave resonator (3A; 3Af) is within a range of $\theta_B \pm 4°$ with reference to $\theta_B$ (°) obtained by an equation (1) where the wavelength is λ (μm), a thickness of the IDT electrode (7A) is $T_{IDT}$ (μm), a specific gravity of the IDT electrode (7A) is $\rho$ (g/cm$^3$), a duty ratio as a value obtained by dividing a width ($W_A$) of the electrode fingers by a half value ($W_A + S_A$) of the electrode finger cycle (repetition cycle $P_{\lambda A}$) is Du, a thickness of the piezoelectric layer (6A) is $T_{LT}$ (μm), and a thickness of the low-acoustic-velocity film (5A) is $T_{VL}$ (μm). A cut angle of the piezoelectric layer (6B) of the second acoustic wave resonator (3B; 3Bf) has larger difference from $\theta_B$ (°) than the cut angle of the piezoelectric layer (6A) of the first acoustic wave resonator (3A; 3Af).

$$\theta_B = 43.09 - 27.5 \times \left(\frac{T_{IDT}}{\lambda} \times \rho - 0.1956\right) - 19.2 \times (D_u - 0.5) + \quad \text{Equation (1)}$$
$$17.4578 \times \left(\frac{T_{LT}}{\lambda} - 0.35\right) + 5.619 \times \left(\frac{T_{VL}}{\lambda} - 0.3\right) +$$
$$32.66 \times \left\{\left(\frac{T_{LT}}{\lambda} - 0.35\right)^2 - 0.0125\right\} +$$
$$24.63 \times \left(\frac{T_{LT}}{\lambda} - 0.35\right) \times \left(\frac{T_{VL}}{\lambda} - 0.3\right)$$

In the acoustic wave device (1; 1c) according to the above-described preferred embodiment, the cut angle (θ1) of the piezoelectric layer (6A) of the first acoustic wave resonator (3A; 3Af) as the antenna end resonator which is electrically closest to the first terminal (101) connected to the antenna (200) is within the range of $\theta_B \pm 4°$. This makes it possible to reduce spurious emission of a Rayleigh wave, which is generated on the lower frequency side than a pass band, while reducing or preventing deterioration in characteristics of the pass band.

In an acoustic wave device (1; 1c) according to a preferred embodiment of the present invention, at least one acoustic wave resonator (31, 32) including the antenna end resonator among the plurality of acoustic wave resonators (31 to 39) is a first acoustic wave resonator (3A; 3Af). The acoustic wave resonators (33 to 39) other than the at least one acoustic wave resonator among the plurality of acoustic wave resonators (31 to 39) are second acoustic wave resonators (3B; 3Bf). The first acoustic wave resonator (3A; 3Af) is a chip that is different from the second acoustic wave resonators (3B; 3Bf).

In the acoustic wave device (1; 1*c*) according to the above-described preferred embodiments, variations in characteristics of the acoustic wave resonators other than the antenna end resonator can be reduced or prevented.

In an acoustic wave device (1; 1*c*) according to a preferred embodiment of the present invention, a material of the piezoelectric layer (6A; 6B) is lithium tantalate or lithium niobate. A material of the low-acoustic-velocity film (5A; 5B) is silicon oxide. A material of the high-acoustic-velocity member (4A; 4B) is silicon.

In the acoustic wave device (1; 1*c*) according to the above-described preferred embodiment, loss can be reduced and a Q value can be increased as compared with the case where the low-acoustic-velocity film (5A; 5B) is not provided.

In an acoustic wave device (1; 1*c*) according to a preferred embodiment of the present invention, each of the first acoustic wave resonator (3Af) and the second acoustic wave resonator (3Bf) further includes a support substrate (44A; 44B). The high-acoustic-velocity member includes a high-acoustic-velocity film (45A; 45B). The high-acoustic-velocity film (45A; 45B) is provided on the support substrate (44A; 44B) and is a film in which an acoustic velocity of a bulk wave propagating in the high-acoustic-velocity film (45A; 45B) is higher than an acoustic velocity of an acoustic wave propagating in the piezoelectric layer (6A; 6B). The low-acoustic-velocity film (5A; 5B) is provided on the high-acoustic-velocity film (45A; 45B).

In the acoustic wave device (1; 1*c*) according to the above-described preferred embodiment, it is possible to reduce or prevent leakage of the acoustic wave to the support substrate (44A; 44B).

In an acoustic wave device (1; 1*c*) according to a preferred embodiment of the present invention, a material of the piezoelectric layer (6A; 6B) is lithium tantalate or lithium niobate. A material of the low-acoustic-velocity film (5A; 5B) is at least one material selected from a group consisting of silicon oxide, glass, silicon oxynitride, tantalum oxide, and a compound obtained by adding fluorine, carbon, or boron to silicon oxide. A material of the high-acoustic-velocity film (45A; 45B) is at least one material selected from a group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond.

In an acoustic wave device (1; 1*c*) according to a preferred embodiment of the present invention, one series arm resonator of the plurality of series arm resonators (acoustic wave resonators 31, 33, 35, 37, and 39) is electrically closer to the first terminal (101) than the plurality of parallel arm resonators (acoustic wave resonators 32, 34, 36, and 38). The one series arm resonator is the antenna end resonator.

In an acoustic wave device (1*c*) according to a preferred embodiment of the present invention, one series arm resonator of the plurality of series arm resonators (acoustic wave resonators 31, 33, 35, 37, and 39) and one parallel arm resonator of the plurality of parallel arm resonators (acoustic wave resonators 32, 34, 36, and 38) are connected directly to the first terminal (101). At least one of the one series arm resonator (acoustic wave resonator 31) and the one parallel arm resonator (acoustic wave resonator 32) is the antenna end resonator.

An acoustic wave device (1; 1*c*) according to a preferred embodiment of the present invention is provided between the first terminal (101) as an antenna terminal and the second terminal (102) that is different from the first terminal (101). The acoustic wave device (1; 1*c*) includes the plurality of acoustic wave resonators (31 to 39). The plurality of acoustic wave resonators (31 to 39) include the plurality of series arm resonators (acoustic wave resonators 31, 33, 35, 37, and 39) and the plurality of parallel arm resonators (acoustic wave resonators 32, 34, 36, and 38). The plurality of series arm resonators (acoustic wave resonators 31, 33, 35, 37, and 39) are provided on the first path (r1) connecting the first terminal (101) and the second terminal (102). The plurality of parallel arm resonators (acoustic wave resonators 32, 34, 36, and 38) are provided on the plurality of second paths (r21, r22, r23, and r24) connecting the plurality of nodes (N1, N2, N3, and N4) on the first path (r1) and ground, respectively. When an acoustic wave resonator that is electrically closest to the first terminal (101) among the plurality of acoustic wave resonators (31 to 39) is an antenna end resonator, the antenna end resonator is the first acoustic wave resonator (3A; 3Af). At least one acoustic wave resonator other than the antenna end resonator among the plurality of acoustic wave resonators (31 to 39) is the second acoustic wave resonator (3B; 3Bf). Each of the first acoustic wave resonator (3A; 3Af) and the second acoustic wave resonator (3B; 3Bf) includes the piezoelectric layer (6A; 6B), the IDT electrode (7A; 7B), the high-acoustic-velocity member (4A; 4B), and the low-acoustic-velocity film (5A; 5B). The IDT electrode (7A; 7B) is provided on the piezoelectric layer (6A; 6B) and includes the plurality of electrode fingers (first electrode fingers 73A and second electrode fingers 74A; first electrode fingers 73B and second electrode fingers 74B). The high-acoustic-velocity member (4A; 4B) is located on a side opposite to the IDT electrode (7A; 7B) with the piezoelectric layer (6A; 6B) interposed therebetween and in which an acoustic velocity of a bulk wave propagating in the high-acoustic-velocity member (4A; 4B) is higher than an acoustic velocity of an acoustic wave propagating in the piezoelectric layer (6A; 6B). The low-acoustic-velocity film (5A; 5B) is provided between the high-acoustic-velocity member (4A; 4B) and the piezoelectric layer (6A; 6B) and is a film in which an acoustic velocity of a bulk wave propagating in the low-acoustic-velocity film (5A; 5B) is lower than an acoustic velocity of a bulk wave propagating in the piezoelectric layer (6A; 6B). A thickness of the piezoelectric layer (6A; 6B) is equal to or less than about $3.5\lambda$ where a wavelength of an acoustic wave, which is determined by an electrode finger cycle as a cycle of the plurality of electrode fingers (first electrode fingers 73A and second electrode fingers 74A; first electrode fingers 73B and second electrode fingers 74B) of the IDT electrode (7A; 7B), is $\lambda$. An intensity of a Rayleigh wave response generated in the first acoustic wave resonator (3A, 3Af) is smaller than an intensity of a Rayleigh wave response generated in the second acoustic wave resonator (3B, 3Bf).

In the acoustic wave device (1; 1*c*) according to the above-described preferred embodiment, a cut angle (θ1) of the piezoelectric layer (6A) of the first acoustic wave resonator (3A; 3Af) as the antenna end resonator which is electrically closest to the first terminal (101) connected to the antenna (200) is within a range of $\theta_B \pm 4°$. This makes it possible to reduce or prevent spurious emission of a Rayleigh wave, which is generated on the lower frequency side than a pass band, while reducing or preventing deterioration in characteristics of the pass band.

A multiplexer (100; 100b) according to a preferred embodiment of the present invention includes the first filter (11) including the acoustic wave device (1; 1c) and the second filter (12). The second filter (12) is provided between the first terminal (101) and the third terminal (103) that is different from the first terminal (101). A pass band of the first filter (11) is in a higher frequency range than a pass band of the second filter (12).

In the multiplexer (100; 100b) according to the above-described preferred embodiment, influences on the second filter (12) by spurious emission of a Rayleigh wave, which is generated in the first filter (11), can be reduced or prevented.

A multiplexer (100b) according to a preferred embodiment of the present invention includes the plurality of resonator groups (30), each group being defined by the plurality of acoustic wave resonators (31 to 39). In the plurality of resonator groups (30), the first terminal (101) is a common terminal and the second terminal (102) is an individual terminal. The antenna end resonators of the plurality of resonator groups (30) are integrated in one chip.

In the multiplexer (100b) according to the above-described preferred embodiment, it is possible to reduce or prevent variations in characteristics of the antenna end resonators of the plurality of resonator groups (30) and reduce the size of the acoustic wave device (1; 1c).

In a multiplexer (100; 100b) according to a preferred embodiment of the present invention, a minimum frequency of the pass band of the first filter (11) is higher than a maximum frequency of the pass band of the second filter (12).

A high-frequency front end circuit (300) according to a preferred embodiment of the present invention includes a multiplexer (100; 100b) according to a preferred embodiment of the present invention and a (first) amplifier circuit (303). The (first) amplifier circuit (303) is connected to the multiplexer (100).

In the high-frequency front end circuit (300) according to the above-described preferred embodiment, it is possible to reduce or prevent spurious emission of a Rayleigh wave.

A communication apparatus (400) according to a preferred embodiment of the present invention includes a high-frequency front end circuit (300) according to a preferred embodiment of the present invention, and a signal processing circuit (RF signal processing circuit 401 and baseband signal processing circuit 402) The signal processing circuit processes a high-frequency signal received by the antenna (200). The high-frequency front end circuit (300) transmits the high-frequency signal between the antenna (200) and the signal processing circuit.

In the communication apparatus (400) according to the above-described preferred embodiment, it is possible to reduce or prevent spurious emission of a Rayleigh wave.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device that is provided between a first terminal defining an antenna terminal and a second terminal different from the first terminal, the acoustic wave device comprising:
a plurality of acoustic wave resonators; wherein
the plurality of acoustic wave resonators include:
   a plurality of series arm resonators provided on a first path connecting the first terminal and the second terminal; and
   a plurality of parallel arm resonators provided on a plurality of second paths connecting a plurality of nodes on the first path and ground, respectively;
when an acoustic wave resonator that is electrically closest to the first terminal among the plurality of acoustic wave resonators is an antenna end resonator; the antenna end resonator is a first acoustic wave resonator; and
at least one acoustic wave resonator other than the antenna end resonator among the plurality of acoustic wave resonators is a second acoustic wave resonator;
each of the first acoustic wave resonator and the second acoustic wave resonator includes:
   a piezoelectric layer;
   an IDT electrode provided on the piezoelectric layer and including a plurality of electrode fingers;
   a high-acoustic-velocity layer located on a side opposite to the IDT electrode with the piezoelectric layer interposed therebetween and in which an acoustic velocity of a bulk wave propagating in the high-acoustic-velocity layer is higher than an acoustic velocity of an acoustic wave propagating in the piezoelectric layer; and
   a low-acoustic-velocity film provided between the high-acoustic-velocity layer and the piezoelectric layer and in which an acoustic velocity of a bulk wave propagating in the low-acoustic-velocity film is lower than an acoustic velocity of a bulk wave propagating in the piezoelectric layer;
a thickness of the piezoelectric layer is equal to or less than about $3.5\lambda$ where a wavelength of an acoustic wave, which is determined by an electrode finger cycle as a cycle of the plurality of electrode fingers of the IDT electrode, is $\lambda$;
a cut angle of the piezoelectric layer of the first acoustic wave resonator is within a range of about $\theta_B \pm 4°$ with reference to $\theta_B$ (°) obtained by an equation (1) where the wavelength is $\lambda$ (μm), a thickness of the IDT electrode is $T_{IDT}$ (μm), a specific gravity of the IDT electrode is $\rho$ (g/cm³), a duty ratio as a value obtained by dividing a width of the electrode fingers by a half value of the electrode finger cycle is Du, a thickness of the piezoelectric layer is $T_{LT}$ (μm), and a thickness of the low-acoustic-velocity film is $T_{VL}$ (μm);

$$\theta_B = 43.09 - 27.5 \times \left(\frac{T_{IDT}}{\lambda} \times \rho - 0.1956\right) - 19.2 \times (D_u - 0.5) + \quad \text{Equation (1)}$$
$$17.4578 \times \left(\frac{T_{LT}}{\lambda} - 0.35\right) + 5.619 \times \left(\frac{T_{VL}}{\lambda} - 0.3\right) +$$
$$32.66 \times \left\{\left(\frac{T_{LT}}{\lambda} - 0.35\right)^2 - 0.0125\right\} +$$
$$24.63 \times \left(\frac{T_{LT}}{\lambda} - 0.35\right) \times \left(\frac{T_{VL}}{\lambda} - 0.3\right);$$

and
a cut angle of the piezoelectric layer of the second acoustic wave resonator has a larger difference from $\theta_B$ (°) than the cut angle of the piezoelectric layer of the first acoustic wave resonator.

2. The acoustic wave device according to claim 1, wherein
at least one acoustic wave resonator including the antenna end resonator among the plurality of acoustic wave resonators is the first acoustic wave resonator;
acoustic wave resonators other than the at least one acoustic wave resonator among the plurality of acoustic wave resonators are the second acoustic wave resonators; and
the first acoustic wave resonator is a chip that is different from the second acoustic wave resonators.

3. The acoustic wave device according to claim 1, wherein
a material of the piezoelectric layer is lithium tantalate or lithium niobate;
a material of the low-acoustic-velocity film is silicon oxide; and
a material of the high-acoustic-velocity layer is silicon.

4. The acoustic wave device according to claim 1, wherein
each of the first acoustic wave resonator and the second acoustic wave resonator includes a support substrate;
the high-acoustic-velocity layer includes a high-acoustic-velocity film provided on the support substrate and in which an acoustic velocity of a bulk wave propagating in the high-acoustic-velocity film is higher than an acoustic velocity of an acoustic wave propagating in the piezoelectric layer; and
the low-acoustic-velocity film is provided on the high-acoustic-velocity film.

5. The acoustic wave device according to claim 4, wherein
a material of the piezoelectric layer is lithium tantalate or lithium niobate;
a material of the low-acoustic-velocity film is at least one material selected from a group consisting of silicon oxide, glass, silicon oxynitride, tantalum oxide, and a compound obtained by adding fluorine, carbon, or boron to silicon oxide; and
a material of the high-acoustic-velocity film is at least one material selected from a group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond.

6. The acoustic wave device according to claim 1, wherein
one series arm resonator of the plurality of series arm resonators is electrically closer to the first terminal than the plurality of parallel arm resonators; and
the one series arm resonator is the antenna end resonator.

7. The acoustic wave device according to claim 1, wherein
one series arm resonator of the plurality of series arm resonators and one parallel arm resonator of the plurality of parallel arm resonators are directly connected to the first terminal; and
at least one of the one series arm resonator and the one parallel arm resonator is the antenna end resonator.

8. An acoustic wave device that is provided between a first terminal as an antenna terminal and a second terminal being different from the first terminal, the acoustic wave device comprising:
a plurality of acoustic wave resonators; wherein
the plurality of acoustic wave resonators include:
a plurality of series arm resonators provided on a first path connecting the first terminal and the second terminal; and
a plurality of parallel arm resonators provided on a plurality of second paths connecting a plurality of nodes on the first path and ground, respectively;
when an acoustic wave resonator that is electrically closest to the first terminal among the plurality of acoustic wave resonators is an antenna end resonator, the antenna end resonator is a first acoustic wave resonator, and
at least one acoustic wave resonator other than the antenna end resonator among the plurality of acoustic wave resonators is a second acoustic wave resonator;
each of the first acoustic wave resonator and the second acoustic wave resonator includes:
a piezoelectric layer;
an IDT electrode provided on the piezoelectric layer and having a plurality of electrode fingers;
a high-acoustic-velocity layer located on a side opposite to the IDT electrode with the piezoelectric layer interposed therebetween and in which an acoustic velocity of a bulk wave propagating in the high-acoustic-velocity layer is higher than an acoustic velocity of an acoustic wave propagating in the piezoelectric layer; and
a low-acoustic-velocity film provided between the high-acoustic-velocity layer and the piezoelectric layer and in which an acoustic velocity of a bulk wave propagating in the low-acoustic-velocity film is lower than an acoustic velocity of a bulk wave propagating in the piezoelectric layer;
a thickness of the piezoelectric layer is equal to or less than about $3.5\lambda$ where a wavelength of an acoustic wave, which is determined by an electrode finger cycle as a cycle of the plurality of electrode fingers of the IDT electrode, is $\lambda$; and
an intensity of a Rayleigh wave response generated in the first acoustic wave resonator is smaller than an intensity of a Rayleigh wave response generated in the second acoustic wave resonator.

9. The acoustic wave device according to claim 8, wherein
at least one acoustic wave resonator including the antenna end resonator among the plurality of acoustic wave resonators is the first acoustic wave resonator;
acoustic wave resonators other than the at least one acoustic wave resonator among the plurality of acoustic wave resonators are the second acoustic wave resonators; and
the first acoustic wave resonator is a chip that is different from the second acoustic wave resonators.

10. The acoustic wave device according to claim 8, wherein
a material of the piezoelectric layer is lithium tantalate or lithium niobate;
a material of the low-acoustic-velocity film is silicon oxide; and
a material of the high-acoustic-velocity layer is silicon.

11. A multiplexer comprising:
a first filter including the acoustic wave device according to claim 1; and
a second filter provided between the first terminal and a third terminal that is different from the first terminal; and
a pass band of the first filter is in a higher frequency range than a pass band of the second filter.

12. The multiplexer according to claim 11, further comprising:
a plurality of resonator groups each defined by the plurality of acoustic wave resonators; wherein in the plurality of resonator groups, the first terminal is a common terminal and the second terminal is an individual terminal; and the antenna end resonators of the plurality of resonator groups are integrated in one chip.

13. The multiplexer according to claim 11, wherein a minimum frequency of the pass band of the first filter is higher than a maximum frequency of the pass band of the second filter.

14. A multiplexer comprising:
a first filter including the acoustic wave device according to claim 8; and
a second filter provided between the first terminal and a third terminal that is different from the first terminal; and
a pass band of the first filter is in a higher frequency range than a pass band of the second filter.

15. The multiplexer according to claim 14, further comprising:
a plurality of resonator groups each defined by the plurality of acoustic wave resonators; wherein
in the plurality of resonator groups, the first terminal is a common terminal and the second terminal is an individual terminal; and
the antenna end resonators of the plurality of resonator groups are integrated in one chip.

16. The multiplexer according to claim 14, wherein a minimum frequency of the pass band of the first filter is higher than a maximum frequency of the pass band of the second filter.

17. A high-frequency front end circuit comprising:
the multiplexer according to claim 11; and
an amplifier circuit connected to the multiplexer.

18. A high-frequency front end circuit comprising:
the multiplexer according to claim 14; and
an amplifier circuit connected to the multiplexer.

19. A communication apparatus comprising:
the high-frequency front end circuit according to claim 17; and
a signal processing circuit that processes a high-frequency signal received by an antenna; wherein
the high-frequency front end circuit transmits the high-frequency signal between the antenna and the signal processing circuit.

20. A communication apparatus comprising:
the high-frequency front end circuit according to claim 18; and
a signal processing circuit that processes a high-frequency signal received by an antenna; wherein
the high-frequency front end circuit transmits the high-frequency signal between the antenna and the signal processing circuit.

* * * * *